US011502103B2

(12) United States Patent
Morris et al.

(10) Patent No.: US 11,502,103 B2
(45) Date of Patent: Nov. 15, 2022

(54) MEMORY CELL WITH A FERROELECTRIC CAPACITOR INTEGRATED WITH A TRANSTOR GATE

(71) Applicant: Intel Corporation, Santa Clara, CA (US)

(72) Inventors: Daniel H. Morris, San Francisco, CA (US); Seiyon Kim, Portland, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 909 days.

(21) Appl. No.: 16/114,272

(22) Filed: Aug. 28, 2018

(65) Prior Publication Data
US 2020/0075609 A1    Mar. 5, 2020

(51) Int. Cl.
*G11C 11/22* (2006.01)
*H01L 27/1159* (2017.01)
(Continued)

(52) U.S. Cl.
CPC ........ *H01L 27/1159* (2013.01); *G11C 11/221* (2013.01); *G11C 11/223* (2013.01);
(Continued)

(58) Field of Classification Search
CPC ........... H01L 27/1159; H01L 29/78391; H01L 29/40111; H01L 29/516; H01L 29/66795;
(Continued)

(56) References Cited

U.S. PATENT DOCUMENTS 5,192,704 A * 3/1993 McDavid ................ G11C 11/22
257/E27.104
5,218,568 A    6/1993 Lin et al.
(Continued)

FOREIGN PATENT DOCUMENTS

CN    104425576 A    3/2015
CN    108110007 A *  6/2018
(Continued)

OTHER PUBLICATIONS

International Search Report and Written Opinion for PCT Application No. PCT/US2016/066056 dated Jul. 28, 2017, 10 pages.
(Continued)

*Primary Examiner* — Viet Q Nguyen
(74) *Attorney, Agent, or Firm* — Akona IP

(57) ABSTRACT

Described herein are ferroelectric (FE) memory cells that include transistors having gates with FE capacitors integrated therein. An example memory cell includes a transistor having a semiconductor channel material, a gate dielectric over the semiconductor material, a first conductor material over the gate dielectric, a FE material over the first conductor material, and a second conductor material over the FE material. The first and second conductor materials form, respectively, first and second capacitor electrodes of a capacitor, where the first and second capacitor electrodes are separated by the FE material (hence, a "FE capacitor"). Separating a FE material from a semiconductor channel material of a transistor with a layer of a gate dielectric and a layer of a first conductor material eliminates the FE-semiconductor interface that may cause endurance issues in some other FE memory cells.

24 Claims, 13 Drawing Sheets

(51) Int. Cl.
*H01L 29/78* (2006.01)
*H01L 21/28* (2006.01)
*H01L 29/51* (2006.01)
*H01L 29/66* (2006.01)

(52) U.S. Cl.
CPC ...... *G11C 11/2255* (2013.01); *G11C 11/2257* (2013.01); *H01L 29/40111* (2019.08); *H01L 29/516* (2013.01); *H01L 29/6684* (2013.01); *H01L 29/66795* (2013.01); *H01L 29/7851* (2013.01); *H01L 29/78391* (2014.09)

(58) Field of Classification Search
CPC ............. H01L 29/6684; H01L 29/7851; G11C 11/221; G11C 11/2255; G11C 11/2257
USPC ........................................................ 365/145
See application file for complete search history.

(56) References Cited

U.S. PATENT DOCUMENTS

| | | | |
|---|---|---|---|
| 5,412,596 A | 5/1995 | Hoshiba | |
| 5,515,311 A | 5/1996 | Mihara | |
| 5,523,964 A * | 6/1996 | McMillan | G11C 11/22 257/295 |
| 6,140,672 A * | 10/2000 | Arita | H01L 21/76895 257/295 |
| 6,438,021 B2 * | 8/2002 | Kato | G11C 11/22 365/145 |
| 6,455,883 B2 * | 9/2002 | Kato | H01L 29/78391 257/295 |
| 6,642,563 B2 * | 11/2003 | Kanaya | H01L 21/76801 257/305 |
| 6,809,951 B2 * | 10/2004 | Yamaguchi | G11C 11/22 365/145 |
| 7,187,575 B2 * | 3/2007 | Kijima | H01L 27/12 365/145 |
| 7,514,734 B2 * | 4/2009 | Aggarwal | H01L 27/11507 438/257 |
| 7,812,384 B2 * | 10/2010 | Ozaki | H01L 27/11502 257/295 |
| 9,679,893 B2 * | 6/2017 | Yan | H01L 27/0733 |
| 10,128,327 B2 * | 11/2018 | Zhang | H01L 27/10844 |
| 2002/0006052 A1 * | 1/2002 | Kato | G11C 11/22 365/145 |
| 2002/0043676 A1 | 4/2002 | Ohtsuka et al. | |
| 2003/0235067 A1 * | 12/2003 | Sakai | G11C 11/22 365/145 |
| 2005/0094457 A1 * | 5/2005 | Chen | H01L 29/78391 365/222 |
| 2006/0268597 A1 | 11/2006 | Sakuma | |
| 2006/0284224 A1 | 12/2006 | Shuto | |
| 2008/0048226 A1 | 2/2008 | Heo et al. | |
| 2008/0121956 A1 | 5/2008 | Kanaya | |
| 2008/0142915 A1 * | 6/2008 | Sashida | H01L 27/11507 257/421 |
| 2008/0303119 A1 | 12/2008 | Watanabe | |
| 2009/0278120 A1 | 11/2009 | Lee et al. | |
| 2010/0039850 A1 * | 2/2010 | Kitazaki | H01L 28/55 365/145 |
| 2010/0321975 A1 | 12/2010 | Kimura et al. | |
| 2012/0314476 A1 | 12/2012 | Appenzeller et al. | |
| 2013/0075717 A1 | 3/2013 | Tsang | |
| 2013/0200361 A1 | 8/2013 | Tsang | |
| 2015/0060957 A1 | 3/2015 | Lee et al. | |
| 2015/0171225 A1 | 6/2015 | Shi et al. | |
| 2016/0027490 A1 | 1/2016 | Müller | |
| 2017/0103988 A1 | 4/2017 | Nishida et al. | |
| 2018/0102374 A1 | 4/2018 | Chavan et al. | |
| 2019/0189357 A1 | 6/2019 | Chavan et al. | |
| 2020/0194443 A1 | 6/2020 | Lin et al. | |
| 2020/0273867 A1 | 8/2020 | Manipatruni et al. | |
| 2021/0398991 A1 | 12/2021 | Manfrini et al. | |

FOREIGN PATENT DOCUMENTS

| | | | | |
|---|---|---|---|---|
| CN | 109148454 A | | 1/2019 | |
| CN | 109542839 A | * | 3/2019 | |
| EP | 1265254 A2 | * | 12/2002 | ............. G11C 11/54 |
| JP | 3169406 B2 | * | 5/2001 | ............. G11C 11/22 |
| JP | 2008153479 A | * | 7/2008 | ........ H01L 27/11502 |
| JP | 4523115 B2 | * | 8/2010 | |
| WO | 2017171739 A1 | | 10/2017 | |
| WO | 2018111215 A1 | | 6/2018 | |
| WO | 2018125024 A1 | | 7/2018 | |
| WO | 2018231210 A1 | | 12/2018 | |

OTHER PUBLICATIONS

International Search Report and Written Opinion for PCT Application No. PCT/US2016/068615 dated Aug. 28, 2017, 12 pages.
European Partial Search Report issued in EP Application No. 19 183 484.5 dated Jan. 14, 2020; 32 pages.
European Extended Search Report dated Feb. 12, 2020 in EP Application No. 19182447.3, 11 pages.
European Partial Search Report dated in European Application No. 19182447.3 on Nov. 6, 2019; 13 pages.
International Search Report and Written Opinion for PCT Application No. PCT/US2016/024828 dated Dec. 26, 2016, 11 pages.
Muller, J., et al., "Ferroelectricity In YTTRIUM-Doped Hafnium Oxide," Journal of Applied Physics; vol. 110, No. 11; Dec. 1, 2011 (5 pages).
PCT Application No. PCT/US2017/056296, filed Oct. 12, 2017, "Recessed Thin-Channel Thin-Film Transistor," 46 pages.
PCT Application No. PCT/US2018/023757, filed Mar. 22, 2018, "Thin Film Transistors Having Double Sates," 40 pages.
Sallese, et al., "Principles of the 1-T DRAM Concept on SOI," LEG Laboratory, Swiss Federal Institute of Technology, EPFL, 1015 Lausanne, Switzerland; 19 pages.
U.S. Appl. No. 15/938,153, dated Mar. 28, 2018,"Dual Gate Control for Trench Shaped Thin Film Transistors," 60 pages.
U.S. Appl. No. 15/942,169, dated Mar. 30, 2018, "Top-Gate Doped Thin Film Transistor," 55 pages.

* cited by examiner

MEMORY CELL WITH A FERROELECTRIC CAPACITOR INTEGRATED WITH A TRANSTOR GATE

BACKGROUND

Embedded memory is important for future generation microprocessors and system-on-a-chip (SoC) technology. Thin-film ferroelectric (FE) materials pave the way for a promising technology that can enable viable embedded memory solutions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
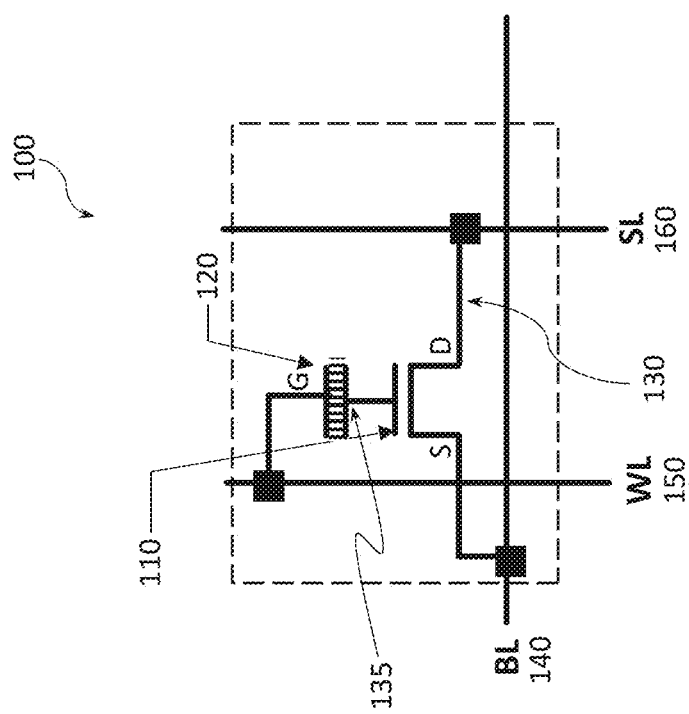
FIG. 1 is a schematic illustration of a memory cell having a FE capacitor integrated with a transistor gate, according to some embodiments of the present disclosure.

Described herein are FE memory cells and corresponding methods and devices. FE memory refers to a memory technology employing FE materials. A FE material is a material that exhibits, over some range of temperatures, a spontaneous electric polarization, i.e., displacement of positive and negative charges from their original position, where a given polarization can be reversed or reoriented by application of an electric field. Because the displacement of the charges in FE materials can be maintained for some time even in the absence of an electric field, such materials may be used to implement memory cells. The term "ferroelectric" is said to be adopted to convey the similarity of FE memories to ferromagnetic memories, despite the fact that there is typically no iron (Fe) present in FE materials.

FE memories have the potential for adequate non-volatility, short programming time, low power consumption, high endurance, and high speed writing. In addition, FE memories have the potential to be manufactured using processes compatible with the standard complementary metal-oxide-semiconductor (CMOS) technology. Therefore, over the last few years, these types of memories have emerged as promising candidates for many growing applications, e.g., digital cameras and contactless smart cards.

Commercial viability of a FE memory cell may depend on the number of factors. One factor is the ability to manufacture dense memory arrays using simple, low-cost process additions. Another factor is cell's performance characteristics.

Some state of the art FE memory cells suffer from endurance issues due to charging at the FE-semiconductor interface that may take place when a FE material is provided directly on top of a semiconductor material. Some utilize large FE capacitors, thus making the memory cells larger, decreasing the memory density. Some involve complex fabrication sequences, increasing fabrication costs and hindering large-scale adoption of the technology. Improvements on one or more of these challenges would be desirable.

FE memory cells disclosed herein include transistors, e.g., metal-oxide-semiconductor field-effect transistors (MOSFETs), having gates with FE capacitors integrated therein. An example memory cell includes a transistor having a semiconductor material that may serve as a channel material (i.e., a material in which, during operation of the transistor, one or more conductive channels are formed, a "semiconductor channel material"), a gate dielectric provided over at least a portion of the semiconductor material, a first conductor material provided over at least a portion of the gate dielectric, a FE material provided over at least a portion of the first conductor material, and a second conductor material provided over at least a portion of the FE material. The first and second conductor materials form, respectively, first and second capacitor electrodes of a FE capacitor, where the first and second capacitor electrodes are separated by the FE material (hence, the capacitor is referred to as a "FE capacitor"). Such a FE capacitor may be described as being "integrated" with a transistor gate because the first capacitor electrode is provided over the gate dielectric material and, in particular, because the FE capacitor is provided in place of a typical gate electrode metal of a conventional MOSFET. Thus, the FE capacitor may be described as being "coupled to a gate terminal" of a transistor by sharing one of its capacitor electrodes with a gate electrode of the transistor. The transistor may be used for both READ and WRITE access to the FE capacitor. The FE material employed in the FE capacitor may be one of the novel materials exhibiting FE behavior at thin dimensions, such as hafnium zirconium oxide (HfZrO, also referred to as HZO, which is a material that includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), and yttrium-doped (Y-doped) hafnium oxide (which is a material that includes hafnium, oxygen, and yttrium).

Various embodiments of FE memory cells described herein may achieve one or more of a number of advantages compared to other memory cells. One advantage is that separating a FE material from a semiconductor channel material of a transistor with a layer of a gate dielectric and a layer of a first conductor material eliminates the FE-semiconductor interface that may cause endurance issues in some other FE memory cells. Another advantage is that FE memory cells described herein may be fabricated using relatively simple, low-cost fabrication processes. Yet other advantages include eliminating the need for a large capacitor and a very-low leakage transistor, ability to form dense memory arrays, and sufficiently small parasitic capacitance. Other technical effects will be evident from various embodiments described here.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. As used herein, a "logic state" of a FE memory cell refers to one of a finite number of states that the cell can have, e.g., logic states "1" and "0," each state represented by a different polarization of the FE material of the cell. As used herein, a "READ" and "WRITE" memory access or operations refer to, respectively, determining/sensing a logic state of a memory cell and programming/setting a logic state of a memory cell. In various embodiments, the terms "oxide," "carbide," "nitride," etc. refer to compounds containing, respectively, oxygen, carbon, nitrogen, etc., while the term "high-k dielectric" refers to a material having a higher dielectric constant (k) than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer may be in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 10A-10B, such a collection may be referred to herein without the letters, e.g., as "FIG. 10."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Memory cells having FE capacitors integrated with transistor gates as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Unit Memory Cell with a FE Capacitor Integrated with a Transistor Gate

FIG. 1 is a schematic illustration of a memory cell (unit cell) 100 having a FE capacitor integrated with a transistor gate, according to some embodiments of the present disclosure. As shown, the memory cell 100 may include a transistor 110 and a FE capacitor 120.

The transistor 110 has a gate terminal, a source terminal, and a drain terminal, indicated in the example of FIG. 1 as terminals G, S, and D, respectively. As is commonly known, source and drain terminals are interchangeable in transistors. Therefore, while the example of FIG. 1 illustrates a source terminal on the left side of the drawing and a drain terminal on the right side, in other embodiments, this arrangement may be reversed. Together, source and drain terminals of a transistor may be referred to a "transistor terminal pair," where the individual ones of these two terminals may be referred to as a "first source or drain (S/D) terminal" and a "second S/D terminal" (e.g., when the first S/D terminal is a source terminal, then the second S/D terminal is a drain terminal, and vice versa).

In various embodiments, the transistor 110 may be any metal-oxide-semiconductor (MOS) transistors which include drain, source, and gate terminals. Embodiments of the present disclosure are explained below with reference to field-effect transistors (FET). The transistor 110 may be either an N-type metal-oxide-semiconductor (NMOS), N-type MOSFET transistor, or a P-type metal-oxide-semiconductor (PMOS), P-type MOSFET transistor. Furthermore, in various embodiments, transistor 110 can have planar or non-planar architecture, as suitable for a particular implementation. Recently, transistors with non-planar architecture, e.g., fin-FETs, have been extensively explored as promising alternatives to transistors with planar architecture. Therefore, embodiments of the present disclosure are explained below and illustrated with reference, but are not limited, to the transistor 110 being a fin-FET. However, these explanations can be easily extended to embodiments of non-planar transistors having architecture other than fin-FET, e.g., to nanowire or nanoribbon transistors, as well as to embodiments of transistors having planar architecture, all of which embodiments being, therefore, within the scope of the present disclosure.

A fin-FET refers to a FET having a non-planar architecture where a fin, formed of one or more semiconductor materials, extends away from a base. Fin-FETs are sometimes interchangeably referred to as "tri-gate transistors," where the name "tri-gate" originates from the fact that, in use, such a transistor may form conducting channels on three "sides" of the fin. However, in general, a fin-FET can be such that less than three conducting channels are formed during operation. Fin-FETs potentially improve performance relative to planar transistors.

In a fin-FET, sides of a portion of a fin that is closest to a base are enclosed by a dielectric material, typically an oxide, commonly referred to as a "shallow trench isolation" (STI). In a conventional fin-FET, a gate stack that includes a stack of one or more gate electrode metals and a stack of one or more gate dielectrics is provided over the top and sides of the remaining upper portion of the fin (i.e., the portion that extends above the STI), thus wrapping around the upper portion of the fin and forming a three-sided gate of a fin-FET. The portion of the fin that is enclosed by the STI is referred to as a "sub-fin" while the portion of the fin over which the gate stack wraps around is referred to as a "channel" or a "channel portion." A semiconductor material of which the channel portion of the fin is formed is commonly referred to as a "semiconductor channel material" or, simply, a "channel material." A source region and a drain region are provided on the opposite ends of the fin, on either side of the gate stack, forming, respectively, a source and a drain of such a transistor.

The transistor 110 is different from a conventional fin-FET described above in that, instead of the one or more gate electrode metals of the gate stack, the transistor 110 includes the FE capacitor 120. The FE capacitor 120 includes first and second capacitor electrodes, separated from one another by a FE material. Thus, instead of a regular dielectric material used in conventional dielectric (i.e., not FE) capacitors, the FE capacitor 120 includes a FE material, separating conductors of the first and second capacitor electrodes. The first capacitor electrode may be provided between the one or more gate dielectrics of the gate stack of the transistor 110 and the FE material, while the FE material is provided between the first and second capacitor electrodes. In this manner, the FE capacitor 120 of the memory cell 100 is integrated into a transistor gate of the transistor 110.

In the following, the electrode of the FE capacitor 120 provided between the one or more gate dielectrics of the gate stack and the FE material is referred to as a "first capacitor electrode" or a "bottom capacitor electrode," while the other electrode of the FE capacitor 120 is referred to as a "second capacitor electrode" or a "top capacitor electrode." In the memory cell 100, the FE material is separated from the semiconductor channel material of the transistor 110 by at least the one or more gate dielectrics underneath the bottom capacitor electrode, which may provide an improvement with respect to endurance limitations experienced by some FE memory cells where an FE material is provided directly on the semiconductor channel material.

As shown in FIG. 1, in the memory cell 100, the top capacitor electrode of the FE capacitor 120, which may be considered to be the gate terminal of the transistor 110, is coupled to a word-line (WL) 150, one of the S/D terminals (e.g., a source terminal) of the transistor 110 is coupled to a bit-line (BL) 140, and the other one of the S/D terminals (e.g., a drain terminal) of the transistor 110 is coupled to a select-line (SL). As described in greater detail below, together, the WL, BL, and SL are used to read and program the FE capacitor 120. Each of the WL, BL, and SL may be made of the same or different electrically conductive materials, alloys, or stacks of multiple electrically conductive materials. In some embodiments, various electrically conductive materials that may be used for the WL, BL, and SL may include one or more metals or metal alloys, with metals such as copper, ruthenium, palladium, platinum, cobalt, nickel, hafnium, zirconium, titanium, tantalum, and aluminum. In some embodiments, various electrically conductive materials that may be used for the WL, BL, and SL may include one or more electrically conductive alloys oxides or carbides of one or more metals.

Also shown in FIG. 1 is the storage node (SN), described in greater detail below, which may also be referred to as a floating node (FN) 135, also described in greater detail below, which may include/be the bottom capacitor electrode of the FE capacitor 120, and may also include/be the gate of the transistor.

Array of Unit Cells with FE Capacitors Integrated with Transistor Gates

Figure 2:
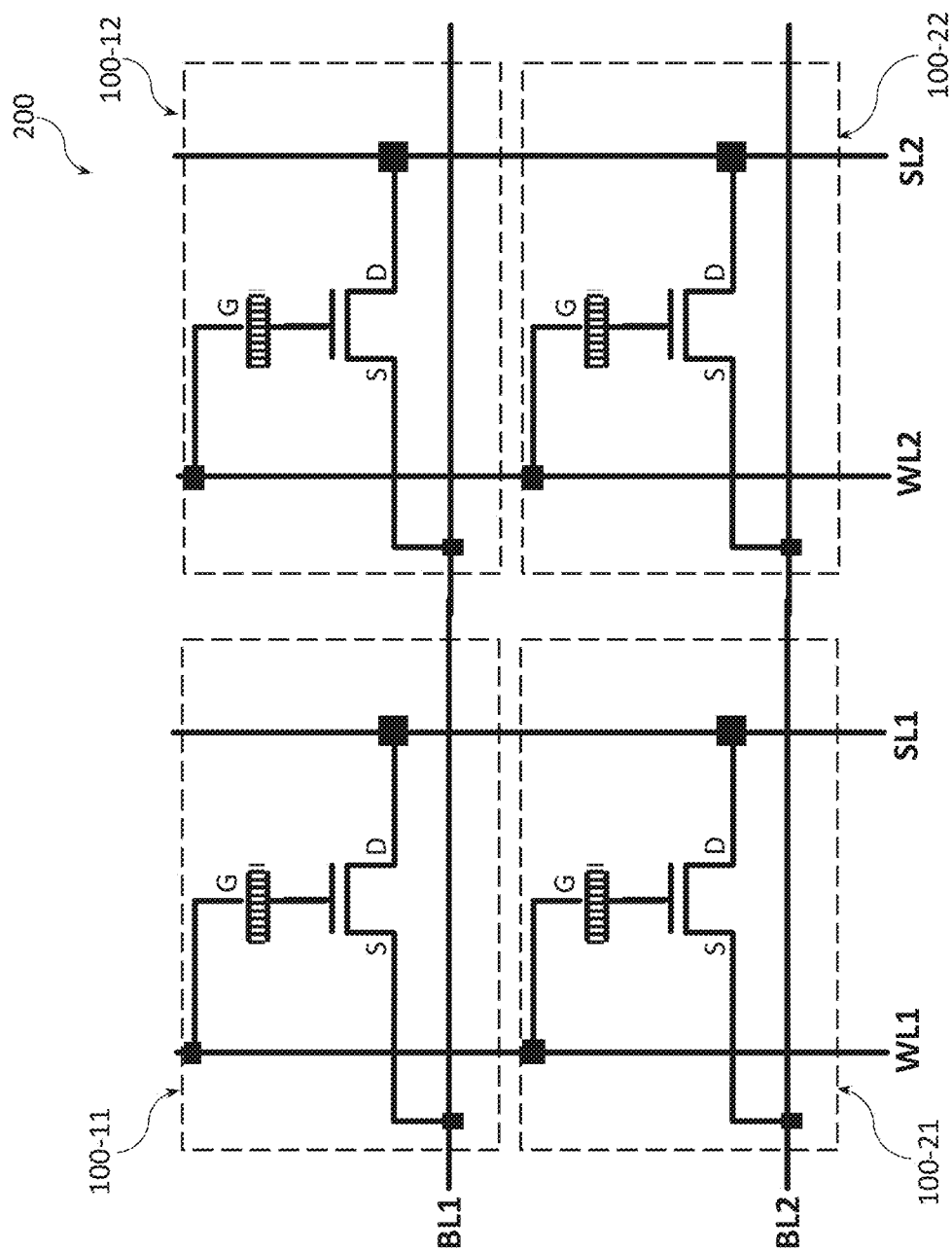
FIG. 2 provides a schematic illustration of a plurality of memory cells of FIG. 1 arranged in an array, according to some embodiments of the present disclosure.

The memory cell 100 as shown in FIG. 1 is a "unit cell," where a plurality of such unit cells may be arranged in an array to implement a memory device. FIG. 2 provides a schematic illustration of a plurality of memory cells 100 of FIG. 1, namely four cells, arranged in an array 200, according to some embodiments of the present disclosure. Each memory cell shown in FIG. 2 could be any one of the memory cells having a FE capacitor integrated with a transistor gate as described herein, e.g., any of the embodiments of the memory cell 100. Individual memory cells 100 are illustrated in FIG. 2 to be within one of the dashed boxes labeled 100-11, 100-12, 100-21, and 100-22. While only four memory cells 100 are shown in FIG. 2, in other embodiments, the array 200 may, and typically would, include many more memory cells. Furthermore, in other embodiments, the memory cells 100 may be arranged in arrays in a manner other than what is shown in FIG. 2, e.g., in any suitable manner of arranging memory cells into arrays as known in the art, all of which being within the scope of the present disclosure.

In some embodiments, each of the BL 140, the WL 150, and the SL 160 can be shared among multiple, possibly different subsets of, memory cells 100. FIG. 2 illustrates one such embodiment where, as shown, the BL 140 can be shared among multiple memory cells 100 in a column, and each of the WL 150 and the SL 160 can be shared among multiple memory cells 100 in a row. As is conventionally used in context of memory, the terms "row" and "column" do not reflect the, respectively, horizontal and vertical orientation on a page of a drawing illustrating a memory array but, instead, reflect on how individual memory cells are addressed. Namely, memory cells 100 sharing a single BL are said to be in the same column, while memory cells sharing a single WL are said to be on the same row. Thus, in FIG. 2, the horizontal lines refer to columns while vertical lines refer to rows. Different instances of each line (BL, WL, and FL) are indicated in FIG. 2 with different reference numerals, e.g., BL1 and BL2 are the two different instances of the BL 140 as described herein. The same reference numeral on the different lines WL and SL indicates that those lines are used to address/control the memory cells in a single row, e.g., WL1 and SL1 are used to address/control the memory cells 100 in row 1, and so on. Each memory cell 100 may then be addressed by using the BL corresponding to the column of the cell and by using the WL and SL corresponding to the row of the cell. For example, as shown in FIG. 2, the memory cell 100-11 is controlled by BL1, WL1, and SL1, the memory cell 100-12 is controlled by BL1, WL2, and SL2, and so on.

Top-Down and Cross-Sectional Views of a Memory Array

While FIGS. 1 and 2 provide schematic illustrations where the transistors 110 and the FE capacitors 120 of the memory cells 100 are shown using their electrical circuit representations, FIGS. 3-6 provide various views of an IC device having a plurality of the memory cells 100 and illustrating various material layers and possible layouts.

Figure 3:
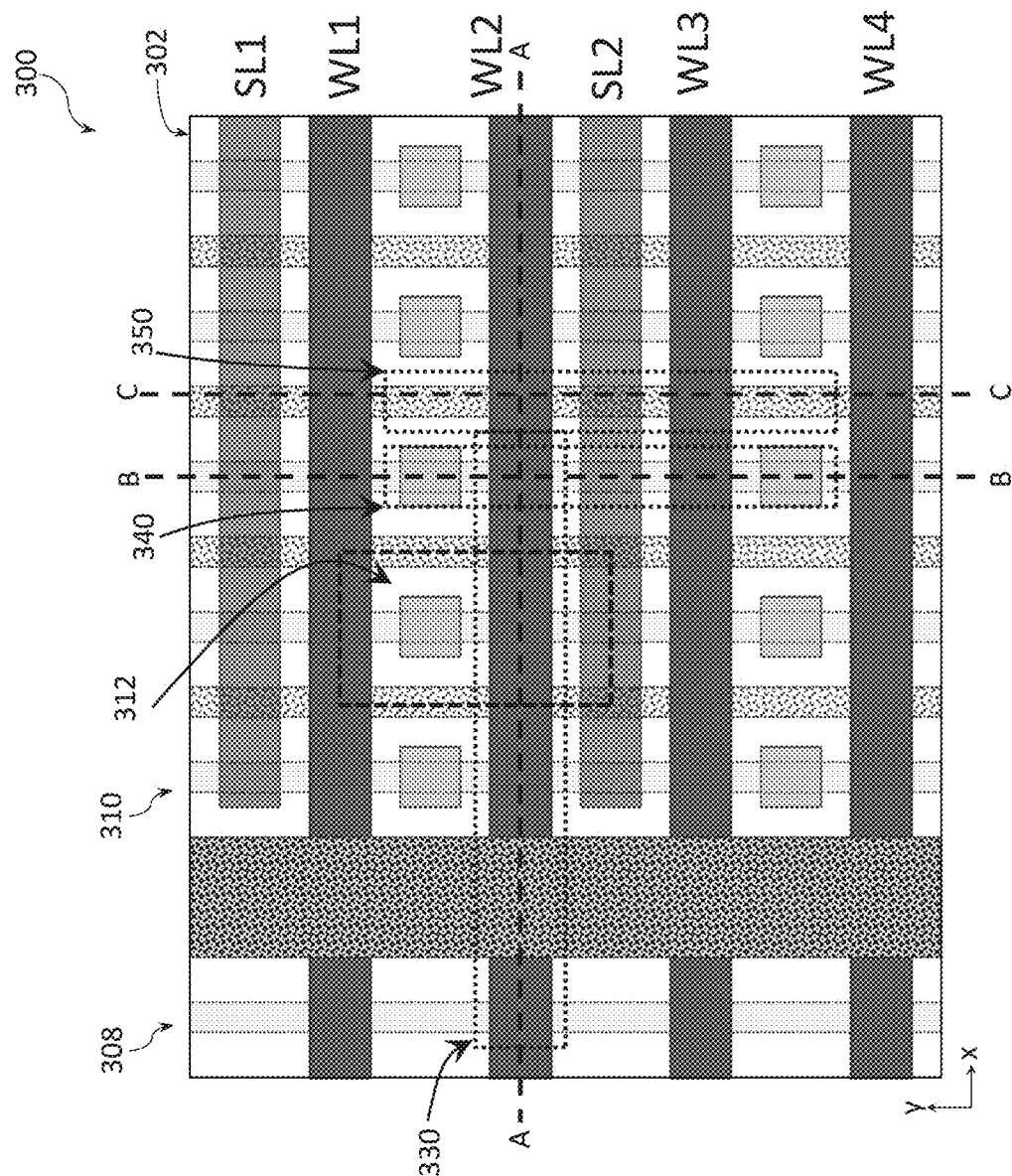
FIG. 3 provides a top view of an example integrated circuit (IC) device having a plurality of memory cells of FIG. 1 implementing one example transistor architecture, according to some embodiments of the present disclosure.

FIG. 3 provides a top view of an example IC device 300 having a plurality of memory cells having FE capacitors integrated with transistor gates, e.g., a plurality of the memory cells 100, according to some embodiments of the present disclosure. The IC device 300 illustrates memory cells implementing one particular example transistor architecture, namely, fin-FET architecture, but, as described above, descriptions provided with respect to the IC device 300 may be extended to other transistor architectures for the transistors 110 of the memory cells 100. Although a particular number of memory cells 100 are illustrated in FIG. 3, this is simply for ease of illustration, and any greater number of memory cells 100 may be provided within the IC device 300, e.g., any different number of memory cells along each fin 302, according to various embodiments of the present disclosure. Furthermore, note that the arrangement shown in FIG. 3 is intended to show relative arrangements of some of the components therein, and that the arrangement of the IC device 300 with the memory cells 100, or portions thereof, may include other components that are not illustrated in FIG. 3 (e.g., additional layers, such as a spacer layer around the various conductors, etc.).

Figure 4:
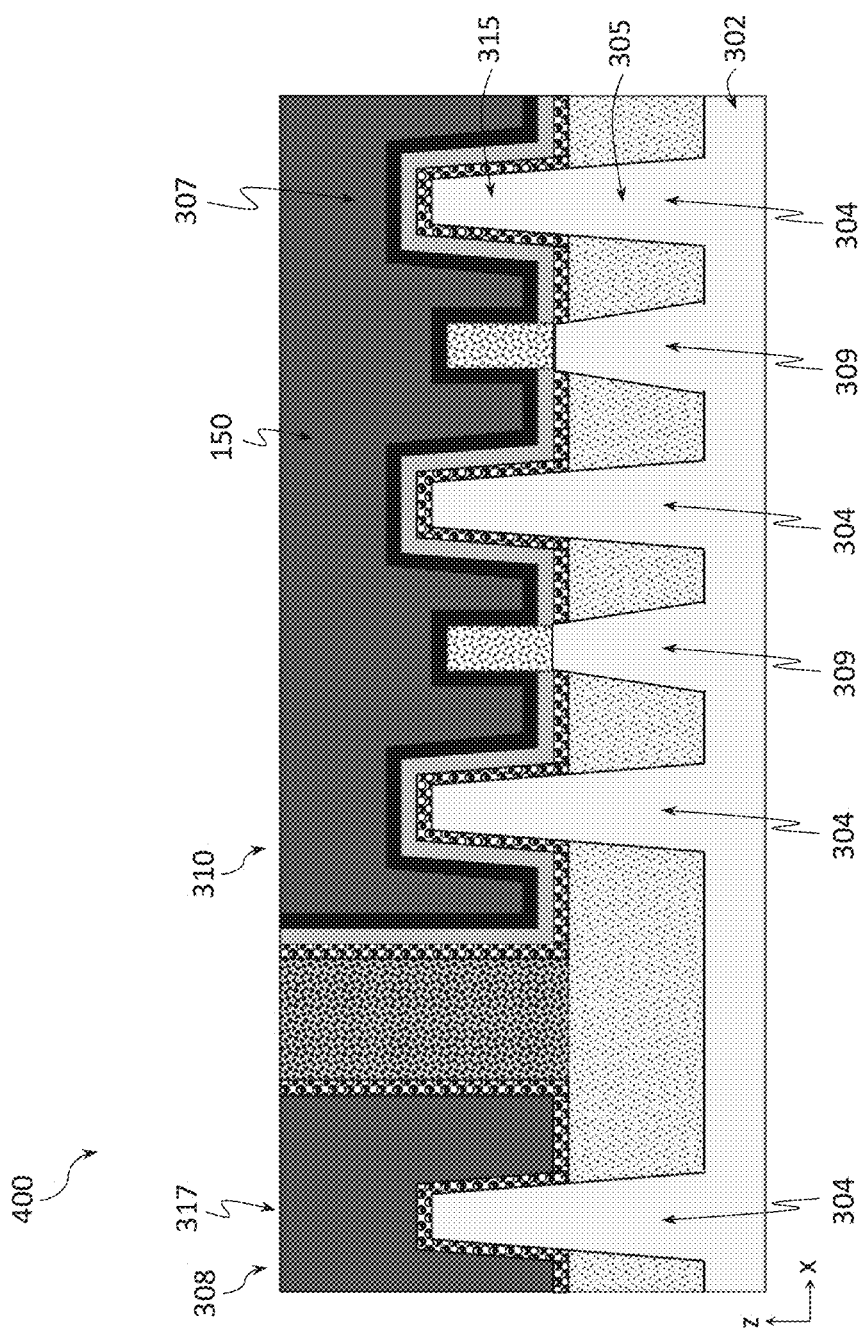
FIG. 4 is a cross-sectional side view along a plane AA of the example IC device shown in FIG. 3, according to some embodiments of the present disclosure.
Figure 5:
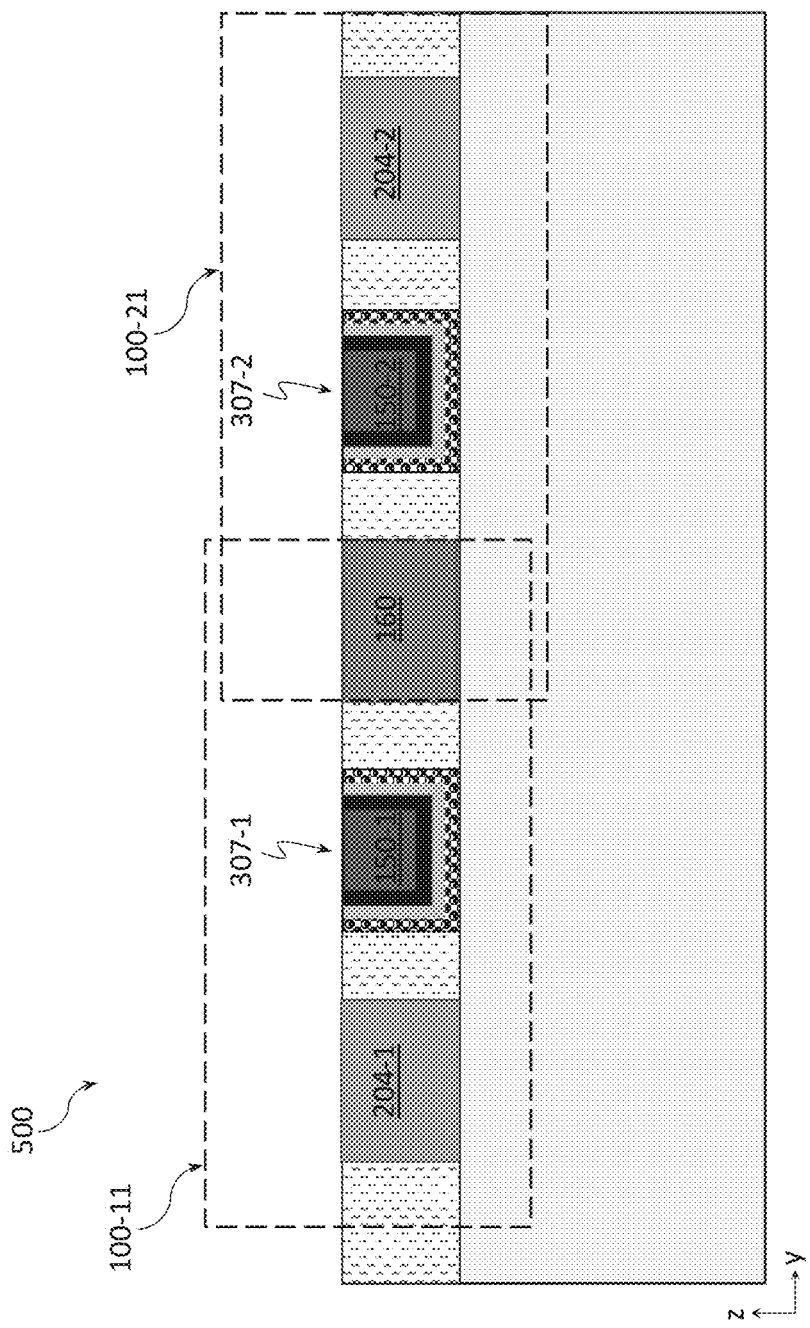
FIG. 5 is a cross-sectional side view along a plane BB of the example IC device shown in FIG. 3, according to some embodiments of the present disclosure.
Figure 6:
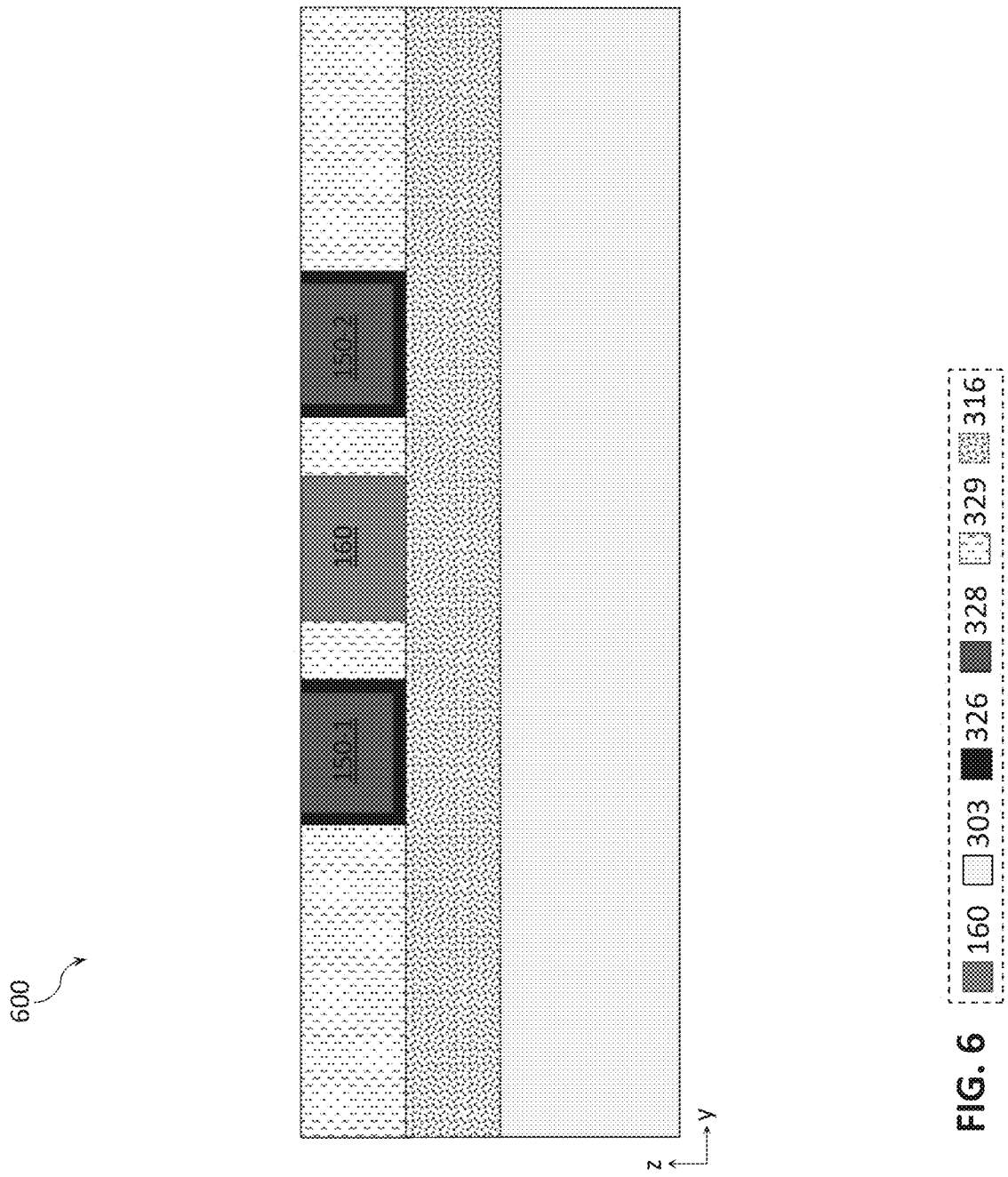
FIG. 6 is a cross-sectional side view along a plane CC of the example IC device shown in FIG. 3, according to some embodiments of the present disclosure.

FIGS. 4-6 provide various cross-sectional side views along different planes of the IC device 300 shown in FIG. 3. In particular, if the top-down view of FIG. 3 is a view of the x-y plane of an example x-y-z coordinate system according to the right-hand rule as shown in FIG. 3, FIG. 4 illustrates a cross-section of a portion of the IC device 300 taken along the section A-A of FIG. 3 (i.e., the x-z plane of the reference coordinate system shown in FIG. 3), FIG. 5 illustrates a cross-section of a portion of the IC device 300 taken along the section B-B of FIG. 3 (i.e., the y-z plane of the reference coordinate system shown in FIG. 3), and FIG. 6 illustrates a cross-section of a portion of the IC device 300 taken along the section C-C of FIG. 3 (i.e., another z-y plane of the reference coordinate system shown in FIG. 3). It should be noted that the y- and z-axis dimensions shown in FIGS. 5 and 6 may not be exactly to scale with the same dimensions shown in FIGS. 3 and 4 because, if they were, the dimensions of such FIGS. 5 and 6 would be too small to clearly show what is intended to be shown in FIGS. 5 and 6 (i.e., what is described below with reference to FIGS. 5 and 6).

A number of elements labeled in FIG. 1 with reference numerals, as well as some further reference numerals of elements shown in FIGS. 3-6 are indicated in FIGS. 3-6 with different patterns in order to not clutter the drawings, with a legend showing the correspondence between the reference numerals and patterns being provided at the bottom of FIGS. 3-6. For example, the legend illustrates that FIGS. 3-6 use different patterns to show the WL 150, the SL 160, the fin 304, etc.

As shown in FIG. 3, the IC device 300 includes a base 302, on which a plurality of fins 304 are provided. As explained in greater detail below, the fins 304 can be used for forming fin-FETs to implement the transistors 110 of the memory cells 100 arranged in an array in the IC device 300.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments, the base 302 from which a fin of a semiconductor channel material extends may include any such substrate that provides a suitable surface for providing the arrangement having the memory cell 100.

FIG. 3 illustrates that, in general, the IC device 300 may include two regions which may be separated from one another by a spacer 306 that may be referred to as a "region spacer." A logic region 308 shown in FIG. 3 to the left of the region spacer 306 may be a region where logic devices are implemented, while a memory region 310 shown in FIG. 3 to the right of the region spacer 306 may be a region where memory cells are implemented. FIG. 3 illustrates an embodiment where both logic devices and memory cells are implemented based on the fin-FETs with the fins 304. However, in other embodiments, any of the logic devices or memory cells of the IC device 300 may be implemented differently. In still other embodiments, the IC device 300 may not include the logic region 308 and/or the region spacer 306, or the logic devices and memory cells may be arranged within the IC device 300 in manner other than that shown in FIG. 3.

FIG. 3 further illustrates individual unit cells 312 of an array of such unit cells within the IC device 300 (only one unit cell 312 is labeled in FIG. 3 with a dashed contour and a reference numeral, in order to not clutter the drawing), where each unit cell 312 is an example of the memory cell 100, described above.

FIG. 3 further illustrates a plurality of WLs 150, a plurality of SLs 160, and contacts 314 to the BLs (FIG. 3 does not specifically illustrate the BLs 140 in order to not clutter the drawing). FIG. 3 also illustrates a plurality of spacers 316, which may be used to provide electrical isolation between portions of adjacent memory cells 312 and may, therefore, be referred to as "memory cell spacers." In some embodiments, the memory cell spacers 316 may be implemented as fins as well (e.g., as shown in FIG. 4 and explained below).

As shown in FIG. 3, in the IC device 300, the fins 304 are provided below (in terms of the location along the z-axis of the reference coordinate system of FIG. 3) the SLs, BLs, and the WLs. As also shown in FIG. 3, in some embodiments of the IC device 300, a single WL may extend over multiple fins 304, both in the memory region 310 and in the logic region 308. In some embodiments, such a WL may be formed in a single fabrication process for both the memory region 310 and the logic region 308, but later interrupted by the region spacer 306 in order to electrically separate the conductor that will serve as the WL in the memory region 310 and that conductor (and a former part of a single continuous line) that will serve as a gate electrode metal for the logic devices in the logic region 308. In other words, a continuous conductor may extend over multiple fins 304 in the memory region 310, and another continuous conductor may extend over multiple fins 304 in the logic region 308. As also shown in FIG. 3, in some embodiments of the IC device 300, different BL contacts 314 may be provided over different portions of a single fin 304 in order to provide electrical connectivity between the BL 140 and first S/D terminals of different memory cells 312. As further shown in FIG. 3, in some embodiments of the IC device 300, a single SL may extend over multiple fins 304 (but only in the memory region 310) in order to provide electrical connectivity between the SL 160 and second S/D terminals of different memory cells 312.

Further details of the IC device 300 are described with reference to the cross-sections of FIGS. 4-6.

FIG. 4 is a cross-sectional side view 400 of the IC device 300 for a portion 330 along a plane AA as shown in FIG. 3, according to some embodiments of the present disclosure. Thus, the cross-section 400 is a cross-section along one WL of the IC device 300. The cross-section 400 illustrates three example fins 304 in the memory region 310 and one example fin 304 in the logic region 308. In the fin-FET architecture, the fin 304, formed of a semiconductor channel material 303, may extend from the base 302 (the base 302 may be formed of the same material 303 as the fin 304, which is illustrated in FIG. 4 with the same pattern used for the fins 304 and the base 302; however it does not have to be so in other embodiments).

A dielectric material may form an STI 320 disposed on either side of each of the fins 304. A portion of each fin 304 enclosed by the STI 320 forms a sub-fin 305 (only one instance of which is labeled in FIG. 4 in order to not clutter the drawing). In some embodiments, the STI 320 may be any suitable low-k dielectric.

Although the fin 304 illustrated in FIG. 4 is shown as having a trapezoidal cross-section in a y-z plane of the reference coordinate system shown, the fin 304 may instead have a cross-section that is rectangular, and/or rounded or sloped at the "top" of the fin 304, and the gate stack 307 (or at least the gate dielectric 322, the first conductor material 324, and the FE material 326 of the gate stack 307) may conform to this rectangular, rounded, and/or sloped fin 304.

For the memory region 310, a portion of the fins 304 that is not enclosed by the STI 320, i.e., an upper portion of the fins 304 that may be referred to as a "channel portion" 315 (only one instance of which is labeled in FIG. 4 in order to not clutter the drawing) of each of the fins 304, is wrapped by what can be seen as a modified gate stack 307. As shown in FIG. 4, the modified gate stack 307 includes a gate dielectric 322 provided over the semiconductor channel material of the channel portion 315 of the fin 304 (e.g., in contact with the semiconductor channel material of the channel portion 315 of the fin 304), a first conductor material 324 provided over the gate dielectric 322 (e.g., in contact with the gate dielectric 322), a FE material 326 provided over the first conductor material 324 (e.g., in contact with first conductor material 324), and further including a second conductor material 328 of the WL 150 provided over the FE material 326 (e.g., in contact with the FE material 326).

The modified gate stack 307 may wrap around the fin 304 as shown in FIG. 4, with a channel portion 315 corresponding to the portion of the channel material of the fin 304 wrapped by the modified gate stack 307. In particular, the gate dielectric 322 may wrap around the channel material of the channel portion 315 of the fin 304, the first conductor material 324 may wrap around the gate dielectric 322, and the FE material 326 may wrap around the first conductor material 324, with the second conductor material 328 wrapping around and enclosing the FE material 326. FIG. 4 also illustrates how, in some embodiments, the second conductor material 328 may be continuous across multiple fins 304 in the memory region 310, thus providing a continuous WL 150. Also shown in FIG. 4 is that, in some embodiments, the FE material 326 may be continuous across multiple fins 304 in the memory region 310.

On the other hand, the first conductor material 324 is not continuous as it is interrupted, from one memory cell to another (i.e., for the illustration of FIG. 4—from one fin 304 to another), by the memory cell spacer 316, in order to provide electrical separation between the different cells. The first conductor material 324 may be electrically disconnected from any signal or ground sources, thus being electrically floating (which gives rise to the term FN, e.g., the FN 135 shown in FIG. 1). In various embodiments, the first conductor material 324 may have a thickness between about 1 and 20 nanometers, including all values and ranges therein (e.g., between about 3 and 10 nanometers, or between about 1 and 5 nanometers).

FIG. 4 illustrates that, in some embodiments, the memory cell spacers 316 may be provided over structures 309 that look like recessed versions of the fins 304. Such arrangement may be advantageous in terms of easier manufacturing, e.g., because the structures 309 may be fabricated at the same time with the fins 304. In other embodiments, the structures 309 do not need to be present and the memory cell spacers 316 may be provided, e.g., over the STI 320.

In various embodiments, the memory cell spacers 316 may include any suitable spacer material, e.g., any suitable low-k dielectric material or a stack of such materials. Examples of such materials include, but are not limited to, silicon dioxide, carbon-doped oxide, silicon nitride, organic polymers such as perfluorocyclobutane or polytetrafluoroethylene, fluorosilicate glass (FSG), and organosilicates such as silsesquioxane, siloxane, or organosilicate glass. In some embodiments, one or more of the memory cell spacers 316 may include pores or air gaps to further reduce their dielectric constant. The region spacer 306 may include any of the materials described for the memory cell spacers 316, and may have the same or different material composition than that of the memory cell spacers 316.

In some embodiments, the gate dielectric 322 may include one or more high-k dielectrics including any of the materials discussed herein with reference to the STI material 320. In some embodiments, an annealing process may be carried out on the gate dielectric 322 during manufacture of the memory cell 100 or the IC device 300 to improve the quality of the gate dielectric 322. The gate dielectric 322 may have a thickness that may, in some embodiments, be between about 0.5 nanometers and 3 nanometers, including all values and ranges therein (e.g., between about 1 and 3 nanometers, or between about 1 and 2 nanometers).

The channel material 303 of the fin 304 may be composed of semiconductor material systems including, for example, N-type or P-type materials systems. In some embodiments, the channel material 303 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. The channel material 303 may include a combination of semiconductor materials where one semiconductor material is used for the channel portion 315 of the fin 304 and another material, sometimes referred to as a "blocking material," is used for the sub-fin 305. Such a blocking material is used sometimes to reduce or eliminate sub-fin leakage, an undesirable phenomenon when some of the current is conducted in the sub-fin. In some embodiments, the sub-fin 305 and the channel portion 315 are each formed of monocrystalline semiconductors. In a first embodiment, the sub-fin 305 and the channel portion 315 are each formed of compound semiconductors with a first sub-lattice of at least one element from group III of the periodic table (e.g., Al, Ga, In), and a second sub-lattice of at least one element of group V of the periodic table (e.g., P, As, Sb). The sub-fin 305 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For example N-type transistor embodiments, the channel portion 315 is advantageously a III-V material having a high electron mobility, such as, but not limited to InGaAs, InP, InSb, and InAs. For some such embodiments, the channel portion 315 is a ternary III-V alloy, such as InGaAs or GaAsSb. For some $In_xGa_{1-x}As$ fin embodiments, In content (x) is between 0.6 and 0.9, and advantageously is at least 0.7 (e.g., $In_{0.7}Ga_{0.3}As$). In some embodiments with highest mobility, the channel portion 315 is intrinsic III-V material and not intentionally doped with any electrically active impurity. In alternate embodiments, a nominal impurity dopant level may be present within the channel portion 315, for example to set a threshold voltage Vt, or to provide HALO pocket implants, etc. Even for impurity-doped embodiments however, impurity dopant level within the channel portion 315 is relatively low, for example below $10^{15}$ $cm^{-3}$, and advantageously below $10^{13}$ $cm^{-3}$. The sub-fin 305 is advantageously a III-V material having a significant band offset (e.g., conduction band offset for N-type devices) from the channel portion 315. Example materials, include, but are not limited to, GaAs, GaSb, GaAsSb, GaP, InAlAs, GaAsSb, AlAs, AlP, AlSb, and AlGaAs. In some N-type transistor embodiments where the channel portion 315 is InGaAs, the sub-fin 305 is GaAs, and may also be doped with impurities (e.g., P-type) to a greater impurity level than the channel portion 315. In an alternate heterojunction embodiment, the sub-fin 305 and the channel portion 315 are each group IV semiconductors (e.g., Si, Ge, SiGe). The sub-fin 305 may be a first elemental semiconductor (e.g., Si or Ge) or a first SiGe alloy (e.g., having a wide bandgap). For example P-type transistor embodiments, the channel portion 315 is advantageously a group IV material having a high hole mobility, such as, but not limited to Ge or a Ge-rich SiGe alloy. For some example embodiments, the channel portion 315 has a Ge content between 0.6 and 0.9, and advantageously is at least 0.7. In some embodiments with highest mobility, the channel portion 315 is intrinsic III-V (or IV for P-type devices) material and not intentionally doped with any electrically active impurity. In alternate embodiments, one or more a nominal impurity dopant level may be present within the channel portion 315, for example to set a threshold voltage Vt, or to provide HALO pocket implants, etc. Even for impurity-doped embodiments however, impurity dopant level within the channel portion 315 is relatively low, for example below $10^{15}$ $cm^{-3}$, and advantageously below $10^{13}$ $cm^{-3}$. The sub-fin 305 may advantageously be a group IV material having a significant band offset (e.g., valance band offset for P-type devices) from the fin. Example materials, include, but are not limited to, Si or Si-rich SiGe. In some P-type transistor embodiments, the sub-fin 305 is Si and may also be doped with impurities (e.g., N-type) to a higher impurity level than the channel portion 315.

The fins 304 may include a source region and a drain region on either side of the gate stack 307 (on either side in front or in the back of the plane of drawing shown in FIG. 4, thus not specifically shown in FIG. 4), thus realizing a transistor (i.e., the transistor 110 in the memory region 310). As is well known in the art, source and drain regions are formed for the gate stack of each MOS transistor. As described above, the source and drain regions of a transistor are interchangeable, and a nomenclature of a first terminal and a second terminal of a transistor terminal pair has been introduced for use in the present disclosure. For the transistors 110 in the memory region 310, which transistor 110 is a part of the unit cell 312 shown in FIG. 3, one of the S/D terminals of an individual transistor 110 is coupled to the BL contact 314 that provides electrical connectivity to the BL 140, and the other one of the S/D terminals is coupled to the SL 160.

The source and drain regions of the transistor 110 may generally be formed using either an implantation/diffusion process or an etching/deposition process. In the former process, dopants such as boron, aluminum, antimony, phosphorus, or arsenic may be ion-implanted into the channel material to form the source and drain regions. An annealing process that activates the dopants and causes them to diffuse further into the channel material 303 typically follows the ion implantation process. In the latter process, the channel material 303 may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorus. In further embodiments, the source and drain regions may be formed using one or more alternate semiconductor materials such as germanium or a group III-V material or alloy. And in further embodiments, one or more layers of metal and/or metal alloys may be used to form the source and drain regions.

The transistor 110 may have a gate length (i.e., a distance between source and drain regions, or a distance between different terminals of the transistor terminal pair of the transistor 110), a dimension measured along the fin 304, in the direction of the y-axis of an example reference coordinate system x-y-z shown in FIG. 3, which may, in some embodiments, be between about 5 and 50 nanometers, including all values and ranges therein (e.g., between 22 and 35 nanometers, or between 7 and 30 nanometers). The fin 304 may have a width, a dimension measured in the direction of the x-axis of the reference coordinate system x-y-z shown in FIG. 3, that may, in some embodiments, be between about 3 and 30 nanometers, including all values and ranges therein (e.g., between about 7 and 20 nanometers, or between about 10 and 15 nanometers). The fin 304 may have a height, a dimension measured in the direction of the z-axis of the reference coordinate system x-y-z shown in FIG. 3, which may, in some embodiments, be between about 20 and 350 nanometers, including all values and ranges therein (e.g., between about 20 and 200 nanometers, between about 30 and 180 nanometers, or between about 50 and 150 nanometers).

In some embodiments, as known for transistors, the gate stack 307 may be surrounded by a gate spacer (not shown in FIGS. 3 and 4, but shown, e.g., in FIG. 5 as a gate spacer 329), in order to provide separation between the gate stack 307 and source/drain contacts of a transistor. Such a gate spacer may be made of a low-k dielectric, e.g., any of the materials described herein with reference to the region spacer 306 and the memory cell spacers 316.

In some embodiments, one or both of the first conductor material 324 and the second conductor material 328 may be selected as the same or different gate electrode materials typically used with transistors, where each of the first conductor material 324 and the second conductor material 328 could include a stack of one or more gate electrode materials. In various embodiments, a gate electrode material may include at least one P-type work function metal or N-type work function metal, depending on whether the transistor 110 is a PMOS transistor or an NMOS transistor (P-type work function metal used as a gate electrode material when the transistor 110 is a PMOS transistor and N-type work function metal used as a gate electrode material when the transistor 110 is an NMOS transistor). For a PMOS transistor, metals that may be used for a gate electrode material for one or both of the first conductor material 324 and the second conductor material 328 may include, but are not limited to, ruthenium, palladium, platinum, cobalt, nickel, and conductive metal oxides (e.g., ruthenium oxide). For an NMOS transistor, metals that may be used for a gate electrode material for one or both of the first conductor material 324 and the second conductor material 328 may include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, a gate electrode material used for one or both of the first conductor material 324 and the second conductor material 328 may include a stack of two or more metal layers, where one or more metal layers are work function metal layers and at least one metal layer is a fill metal layer. Further layers may be included next to a gate electrode material selected for one or both of the first conductor material 324 and the second conductor material 328 for other purposes, such as to act as a diffusion barrier layer or/and an adhesion layer.

The FE material 326 is provided between the first conductor material 324 and the second conductor material 328, thus forming a FE capacitor 120 in which the first conductor material 324 forms a first capacitor electrode (bottom capacitor electrode) and the second conductor material 328 forms a second capacitor electrode (top capacitor electrode). The figures presented herein provide example illustrations of embodiments where the FE material 326 replaces a non-ferroelectric dielectric material provided between the two electrodes of a conventional capacitor.

The FE material 326 may include one or more materials which exhibit sufficient FE behavior even at thin dimensions as typically used in scaled transistors as the ones illustrated here. Some examples of such materials known at the moment include HZO, Si-doped hafnium oxide, Ge-doped hafnium oxide, Al-doped hafnium oxide, and Y-doped hafnium oxide. However, in other embodiments, any other materials which exhibit FE behavior at thin dimensions may be used as the FE material 326 and are within the scope of the present disclosure. A layer of the FE material 326 may have a thickness between about 0.5 nanometers and 15 nanometers, including all values and ranges therein (e.g., between about 1 and 8 nanometers, or between about 0.5 and 5 nanometers).

Turning to the logic region 308, the portion 315 of the fins 304 that is not enclosed by the STI 320 may be wrapped by a conventional gate stack 317. As shown in FIG. 4, such a gate stack may include the gate dielectric 322, as described above, and the second conductor material 328, as also described above. In other words, in the logic region 308, the second conductor material 328 forms a conventional gate electrode of logic transistors provided at the fins 304, and the layers of the first conductor material 324 and the FE material 326 are absent. Discussions provided above for the source and drain regions of the transistors 110 in the memory region 310 are applicable to the transistors formed in the logic region 308, as well as a discussion about a gate spacer, which discussions, therefore, in the interests of brevity, are not repeated here.

FIG. 5 is a cross-sectional side view 500 of the IC device 300 for a portion 340 along a plane BB as shown in FIG. 3, according to some embodiments of the present disclosure. Thus, the cross-section 500 is a cross-section along one fin 304 in the memory region 310 of the IC device 300. The cross-section 500 illustrates two BL contacts 204 (labeled in FIG. 5 as BL contacts 204-1 and 204-2), and one SL contact 160 in between the two BL contacts 204. The cross-section 500 further illustrates two modified gate stacks 307 (labeled in FIG. 5 as a gate stack 307-1 between the BL contact 204-1 and the SL 160 and as a gate stack 307-2 between the BL contact 204-2 and the SL 160). The cross-section 500 thus shows two memory cells 100, shown in FIG. 5 with two dashed contours labeled 100-11 and 100-21, taking on the labeling of the individual memory cells used for the array 200 shown in FIG. 2. As in FIG. 2, for the memory cell 100-11 of the cross-section 500 of FIG. 5, the BL contacts 204-1 forms a contact from the a first BL 140 (labeled as "BL1" in FIG. 2) to the first S/D terminal of the first memory cell 100-11 and the corresponding gate stack 307-1 of the first memory cell 100-11 is connected to the first WL 150-1 (labeled as "WL1" in FIG. 2). Similarly, and also as shown in FIG. 2, for the memory cell 100-21 of the cross-section 500 of FIG. 5, the BL contacts 204-2 forms a contact from the a second BL 140 (labeled as "BL2" in FIG. 2) to the first S/D terminal of the second memory cell 100-21 and the corresponding gate stack 307-2 of the second memory cell 100-21 is connected to the second WL 150-2 (labeled as "WL2" in FIG. 2) (the two WLs 150 shown in FIG. 5 as WL 150-1 and WL 150-2 correspond to WL2 and WL3 shown in FIG. 3). As also shown in the cross-section 500 of FIG. 5, the second S/D terminal of the first memory cell 100-11 and the second S/D terminal of the second memory cell 100-21 are connected to the same SL 160 (labeled as "SL1" in FIG. 2). Thus, the SL 160 is shared between the first memory cell 100-11 and the second memory cell 100-21.

The cross-section 500 further illustrates gate spacer 329 between the gate stack 307 and each of the neighboring conductors to source and drain regions of the memory cells 100-11 and 100-21, for each of the gate stacks 307 shown in FIG. 5. Thus, FIG. 5 illustrates the gate spacer 329 provided between the gate stack 307-1 and BL contact 204-1 of the first memory cell 100-11, between the gate stack 307-1 and the SL 160 of the first memory cell 100-11, between the gate stack 307-2 and BL contact 204-2 of the second memory cell 100-21, and between the gate stack 307-2 and the SL 160 of the second memory cell 100-21. As described above, the gate spacer 329 may be made of a low-k dielectric material.

FIG. 6 is a cross-sectional side view 600 of the IC device 300 for a portion 350 along a plane CC as shown in FIG. 3, according to some embodiments of the present disclosure. Thus, the cross-section 600 is a cross-section along one memory cell spacer 316 in the memory region 310 of the IC device 300. The cross-section 600 illustrates two WLs 150 (labeled in FIG. 6 as WL 150-1 and WL 150-2, corresponding to WL2 and WL3 shown in FIG. 3). Unlike the cross-section 500 along the fin 304, the cross-section 600 does not include BL contacts.

Operating a Memory Cell with a FE Capacitor Integrated with a Transistor Gate

Figures 7, 8:
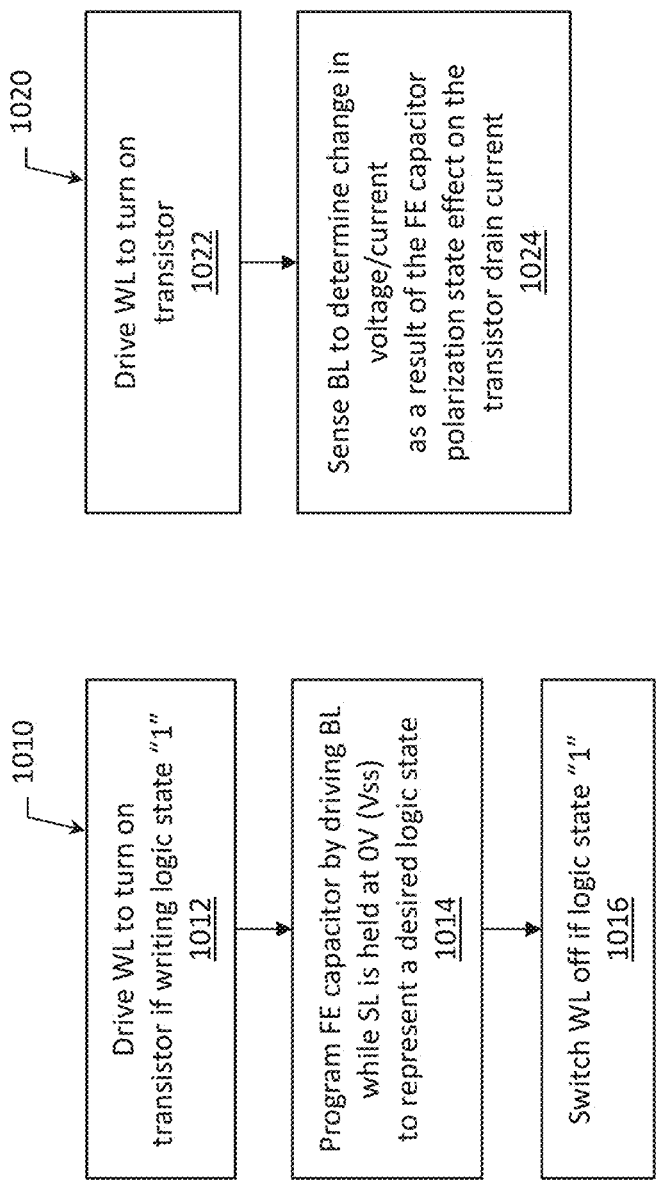
FIG. 7 is a flow diagram of an example method for programming a memory cell having a FE capacitor integrated with a transistor gate, in accordance with various embodiments of the present disclosure.
FIG. 8 is a flow diagram of an example method for reading a memory cell having a FE capacitor integrated with a transistor gate, in accordance with various embodiments of the present disclosure.

Next, methods of operating the memory cell 100 as described herein will be explained, with reference to associated FIGS. In particular, FIGS. 7 and 8 illustrate, respectively, a WRITE operation and a READ operation.

FIG. 7 is a flow diagram of an example method 1010 for operating a memory cell having a FE capacitor integrated with a transistor gate, e.g., the memory cell 100, in particular, for programming (i.e., writing to) such a memory cell, in accordance with various embodiments.

At 1012 shown in FIG. 7, the WL connected to the memory cell 100 may be asserted to turn on the transistor 110 for writing the logic state "1" to the memory cell 100. To this end, e.g., the WL 150 may transition from logic low to logic high to turn on the transistor 110, e.g., by applying voltage (e.g., WL=Vdd) sufficient to turn on the transistor 110, e.g., 1.0 Volts (V). For writing the logic state "0" to the memory cell, the transistor 110 is not turned on (i.e., WL=0 Volts (V)) and 1012 is omitted from the method 1010.

At 1014 shown in FIG. 7, the BL 140 connected to the memory cell 100 is asserted to charge or discharge the FN 135, while the SL 160 is connected to Vss or 0V, to set the desired polarization state of the FE material 326 in the memory cell 100 in order to set a desired logic state. For a WRITE operation, an electric field is applied across the FE material 326 of the FE capacitor 120 in order to polarize the FE material 326 in a direction corresponding to the desired logic state. Such an electric field may be applied by changing the voltage on the BL and/or on the SL coupled to the memory cell 100 (while WL coupled to the memory cell 100 is asserted). In some embodiments, to program a logic state "1," WL=Vdd, BL=0V, and SL=0V, while to program a logic state "0," WL=0V, BL=Vdd, and SL=0V or Vdd, the later may enable a stronger WRITE. More specifically, in order to ensure that the polarization of the FE material 326 in the capacitor 120 is set to the desired state, an electric field of suitable magnitude and direction may be applied across the FE material 326, which is done by applying voltage of sufficiently high magnitude and a predefined polarity at the BL 140 at 1014, for a time period that is equal to or greater than a minimum transition duration (e.g., about 1 to 100 nanoseconds (ns)). The term "minimum transition duration" here generally refers to a suitable duration of time during which a voltage (e.g., due to the voltages on the BL and WL, possibly in combination with the charge on the FN 135) is applied to the FE material 326 to cause the FE material to be polarized and to store a polarization charge according to the applied voltage. The minimum transition duration may be a predetermined value depending on the materials used in the FE material stack 326 and their thicknesses. Some embodiments described herein may use the minimum transition duration of 100 ns, however, this parameter should not be understood to be limiting as the minimum transition duration could be designed to be substantially shorter or longer based upon application-specific requirements. In general, longer minimum transition times can enable lower voltage operation, higher read signals, longer FE retention.

At 1016, if the WL 150 was switched on at 1012 (i.e., if logic state "1" was written), the WL 150 may be switched off, i.e., de-asserted. In some embodiments of 1016, the SL 160 may be switched off as well.

FIG. 8 is a flow diagram of an example method 1020 for reading a memory cell having a FE capacitor integrated with a transistor gate, e.g., the memory cell 100. The method 1020 may be preceded by the method 1010, where, as a result of performing the method 1010, the BL 140 connected to the memory cell 100 may be pre-charged to Vdd to set the FE capacitor 120 to the desired logic state represented by the polarization state set in the FE material 326.

The method 1020 may begin with 1022, where the WL 150 connected to the memory cell 100 is asserted (e.g., the WL 150 transitions from logic low to logic high to turn on the transistor 110), e.g., by applying voltage sufficient to turn on the transistor 110, e.g., 1.0 Volts (V). Once the transistor 110 is switched on, current can flow through it, between the first S/D terminal and the second S/D terminal of the transistor terminal pair as defined herein. Because the FE capacitor 120 is connected in series with the gate of the transistor 110, the current flowing between the first S/D terminal and the second S/D terminal is modulated (i.e., affected/changed) by the polarization state of the FE material 326 in the FE capacitor 120. As described above, the first S/D terminal of the transistor terminal pair of the transistor 110 is coupled to the BL 140, and the second S/D terminal of the transistor 110 is coupled to the SL 160. At 1024 shown in FIG. 8, a sense amplifier coupled to the BL 140 senses the current or voltage on the BL 140 to determine change in current/voltage as a result of the polarization state of the FE capacitor 120 affecting the drain current of the transistor 110 (e.g., if the BL 140 discharges, the bit was "1," if it does not discharge, then the bit can be assumed to be "0").

Referring, again, to the example memory array 200 shown in FIG. 2, during a READ operation of a given memory cell, e.g., according to the method shown in FIG. 8, for unselected words in the array, the WL remains de-asserted (e.g., the WL remains or is transitioned from logic HIGH to logic LOW, e.g., 0V) and the transistors of the array having gate terminals coupled to such WL remain turned off. This will enable clear sensing of the selected memory cell by reducing the current through the unselected memory cells which may be connected to the same BL. For example, during the READ of the memory cell 100-11 shown in FIG. 2, WL1 is asserted so that the transistor 110 of the memory cell 100-11 turns on and a sense amplifier senses current or voltage on the BL1 to determine the logic state of the memory cell 100-11. The memory cell 100-12 is connected to the same bit-line BL1 and, therefore, could, in principle, affect the current or voltage on BL1. However, because WL2 is de-asserted when WL1 is asserted to READ the memory cell 100-11, the transistor of the memory cell 100-12 is off and there is no current flowing through the transistor 110 of the memory cell 100-12 and affecting the reading of the memory cell 100-11. As a result of asserting WL1, the transistor 110 of the memory cell 100-21 also turns on, but since reading of the memory cell 100-11 is performed with a sense amplifier senses current or voltage on the BL1, change in voltage/current on BL2 has no effect on reading the logic state of the memory cell 100-11.

Fabricating a Memory Cell with a FE Capacitor Integrated with a Transistor Gate

Figure 9:
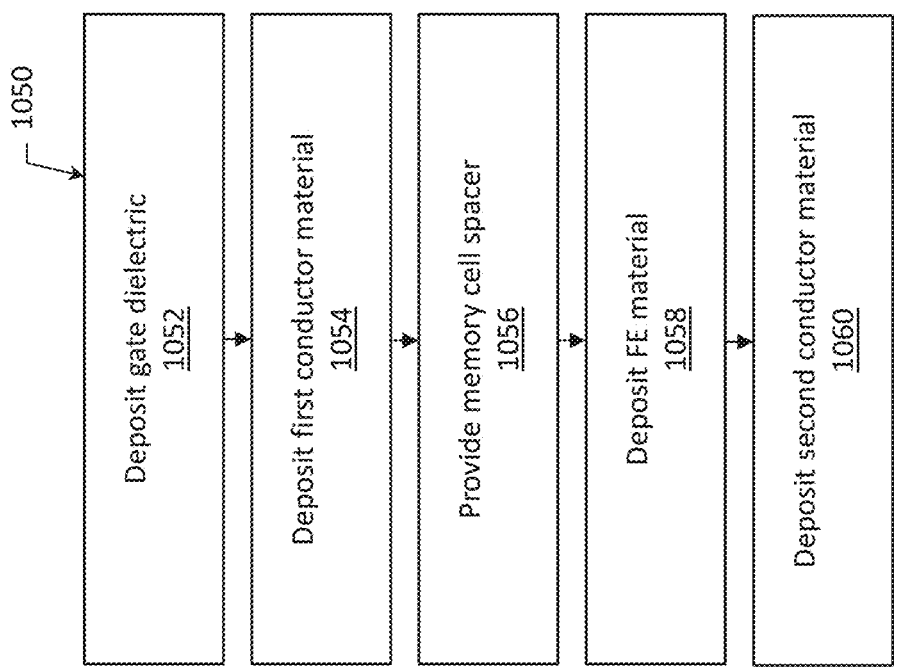
FIG. 9 is a flow diagram of an example method for fabricating a memory cell having a FE capacitor integrated with a transistor gate, in accordance with various embodiments of the present disclosure.

Various embodiments of the memory cells 100 disclosed herein may be manufactured using any suitable techniques. For example, FIG. 9 is a flow diagram of an example method 1050 of manufacturing a memory cell with a FE capacitor integrated with a transistor gate, in accordance with various embodiments. Although the operations of the method 1050 are illustrated once each and in a particular order, the operations may be performed in any suitable order and repeated as desired. For example, one or more operations may be performed in parallel e.g., to manufacture multiple memory cells substantially simultaneously, or/and to manufacture the transistors and the FE capacitors of the memory cells substantially simultaneously. In another example, the operations may be performed in a different order to reflect the structure of a memory device in which the memory cell will be included. In yet another example, some operations may be combined into a single operation, and some operations may be subdivided into more operations than what is shown in FIG. 9.

The method 1050 may begin with depositing a hardmask (HM) to cover the entire die being processes, e.g., a die with logic transistors already being fabricated in the logic region 308, described above. Then the memory region 310 may be opened (e.g., using a suitable mask to remove a portion of the HM above the memory region 310).

At 1052, a gate dielectric may be deposited at suitable locations in the memory region 310. The gate dielectric deposited at 1052 may take on any embodiments of the gate dielectric 322, described above. In some embodiments, the gate dielectric 322 may be deposited using any suitable conformal deposition process, e.g., atomic layer deposition (ALD), so that all exposed surfaces could be covered with the gate dielectric 322.

At 1054, a first conductor material may be deposited at suitable locations in the memory region 310. The first conductor material deposited at 1054 may take on any embodiments of the first conductor material 324, described above. In some embodiments, the first conductor material 324 may be deposited over the gate dielectric 322 using any suitable conformal deposition process, e.g., ALD. In other embodiments, the first conductor material 324 may be deposited over the gate dielectric 322 using other processes for depositing conductive materials, e.g., CVD, plasma-enhanced CVD (PECVD), or physical vapor deposition (PVD).

At 1056, one or more memory cell spacers may be provided at suitable locations in the memory region 310. The memory cell spacers provided at 1056 may take on any embodiments of the memory cell spacers 316, described above. In some embodiments, the memory cell spacers 316 may be deposited using any suitable processes for depositing dielectric materials, possibly in combination with any of suitable patterning techniques, e.g., photolithographic or electron-beam patterning, possibly in combination with using a mask, e.g., a hardmask, and including a suitable etching process to remove portions of materials, e.g., using dry etch, reactive ion etch (RIE), etc. Suitable deposition processes for depositing the dielectric material of the memory cell spacers 316 may include ALD, CVD, spin-coating, or dip-coating.

At 1058, a FE material is deposited over the first conductor material deposited in 1054 and over the memory cell spacers provided in 1056. The FE material deposited 1058 may take on any embodiments of the FE material 326, described above. The FE material 326 may be deposited at 1058 using any suitable deposition and patterning technique known in the art.

At 1060, a second conductor material may be deposited at suitable locations in the memory region 310. The second conductor material deposited at 1060 may take on any embodiments of the second conductor material 328, described above. In some embodiments, the second conductor material 328 may be deposited using any suitable deposition process, e.g., any of those described above for the first conductor material deposited at 1054, possibly in combination with any of suitable patterning techniques, e.g., any of those described above for patterning the memory cell spacers 316 at 1056.

Although not specifically shown in FIG. 9, the method 1050 may further include processes for coupling the memory cell 100 to READ and/or WRITE control lines. Such coupling may take the form of any of the embodiments of the transistor 110 and the FE capacitor 120 coupled to the WL, FL, and BL disclosed herein (e.g., any of the embodiments discussed herein with reference to the coupling as shown in FIGS. 1-6).

In various embodiments, the manufacturing method 1050 may include other operations, not specifically shown in FIG. 9.

For example, in some embodiments, the IC device 300 or the memory cell 100 may be cleaned prior to or/and after any of the processes of the method 1050 described herein, e.g., to remove surface-bound organic and metallic contaminants, as well as subsurface contamination, to promote adhesion, and/or to decrease interdiffusion of materials. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In some embodiments, cleaning may be carried out using chemical or plasma clean, or applying heat in a controlled environment.

In another example, the method 1050 may include operations that include depositing sacrificial materials and providing openings in the sacrificial materials. A sacrificial material may include any material that has sufficient etch selectivity with respect to the surrounding materials so that, after the sacrificial material is deposited, a portion of the sacrificial material can be removed without substantially removing the surrounding materials. As known in the art, two materials are said to have "sufficient etch selectivity" when etchants used to etch one material do not substantially etch the other, enabling selective etching of one material but not the other. In some embodiments, a sacrificial material may be a sacrificial dielectric material. Some examples of such materials include a silicon oxide (i.e., a compound comprising silicon and oxygen, e.g., SiO2), a hafnium oxide (i.e., a compound comprising hafnium and oxygen e.g., HfO2), a silicon nitride (i.e., a compound comprising silicon and nitrogen, e.g., SiN), a silicon oxynitride (i.e., a compound comprising silicon, oxygen, and nitrogen, e.g., SiON), an aluminum oxide (i.e., a compound comprising aluminum and oxygen, e.g., $Al_2O_3$), an aluminum hafnium oxide (i.e., a compound comprising aluminum, hafnium, and oxygen, e.g., AlHfO), a carbon-doped oxide (i.e., a compound comprising carbon and oxygen), organic polymers such as perfluorocyclobutane or polytetrafluoroethylene, FSG, and organosilicates such as silsesquioxane, siloxane, or organosilicate glass. Besides appropriate etching characteristics, some other considerations in selecting a suitable sacrificial material may include e.g., possibilities of smooth film formation, low shrinkage and outgassing, and good dielectric properties (such as low electrical leakage, suitable value of a dielectric constant, and thermal stability). Any suitable deposition techniques may be used to provide the sacrificial material, such as spin-coating, dip-coating, ALD, CVD, PECVD, and thermal oxidation.

In yet another example, the method 1050 may include any suitable planarization/polishing techniques to remove excess or overburden of materials deposited in a given process. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of the desired material.

Example Devices and Components

Memory cells and arrays with FE capacitors integrated with transistor gates as disclosed herein may be included in any suitable electronic device. FIGS. 10-14 illustrate various examples of devices and components that may include one or more memory cells having FE capacitors integrated with transistor gates as disclosed herein.

Figure 10B:
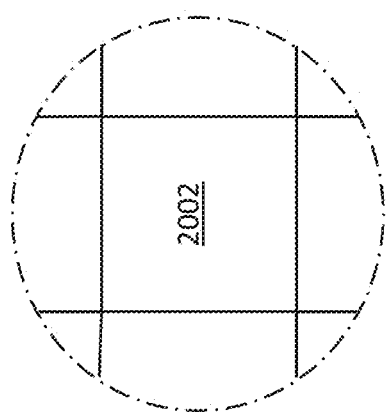
FIGS. 10A-10B are top views of a wafer and dies that may include one or more memory cells having FE capacitors integrated with transistor gates in accordance with any of the embodiments disclosed herein.
Figure 10A:
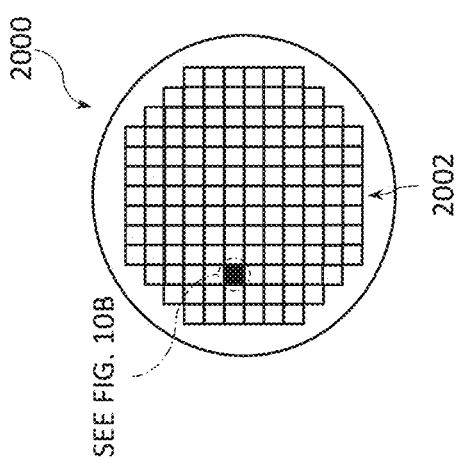

FIGS. 10A-10B are top views of a wafer 2000 and dies 2002 that may include one or more memory cells having FE capacitors integrated with transistor gates in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 12. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory cells having FE capacitors integrated with transistor gates as described herein). After the fabrication of the semiconductor product is complete (e.g., after manufacture of one or more memory cells having FE capacitors integrated with transistor gates as described herein), the wafer 2000 may undergo a singulation process in which each of the dies 2002 is separated from one another to provide discrete "chips" of the semiconductor product. In particular, devices that include one or more memory cells having FE capacitors integrated with transistor gates as disclosed herein may take the form of the wafer 2000 (e.g., not singulated) or the form of the die 2002 (e.g., singulated). The die 2002 may include one or more transistors (e.g., one or more transistors 110 having FE capacitors 120 integrated with transistor gates as described herein and/or one or more of conventional logic transistors, discussed below) and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. In some embodiments, the wafer 2000 or the die 2002 may include a memory device with a plurality of memory cells having FE capacitors integrated with transistor gates, as described herein. Multiple ones of these devices may be combined on a single die 2002. For example, a memory array formed by multiple memory devices, e.g., formed by multiple memory cells having FE capacitors integrated with transistor gates as described herein, may be formed on a same die 2002 as a processing device (e.g., the processing device 2402 of FIG. 14) or other logic that is configured to store information in the memory devices or execute instructions stored in the memory array.

Figure 11:
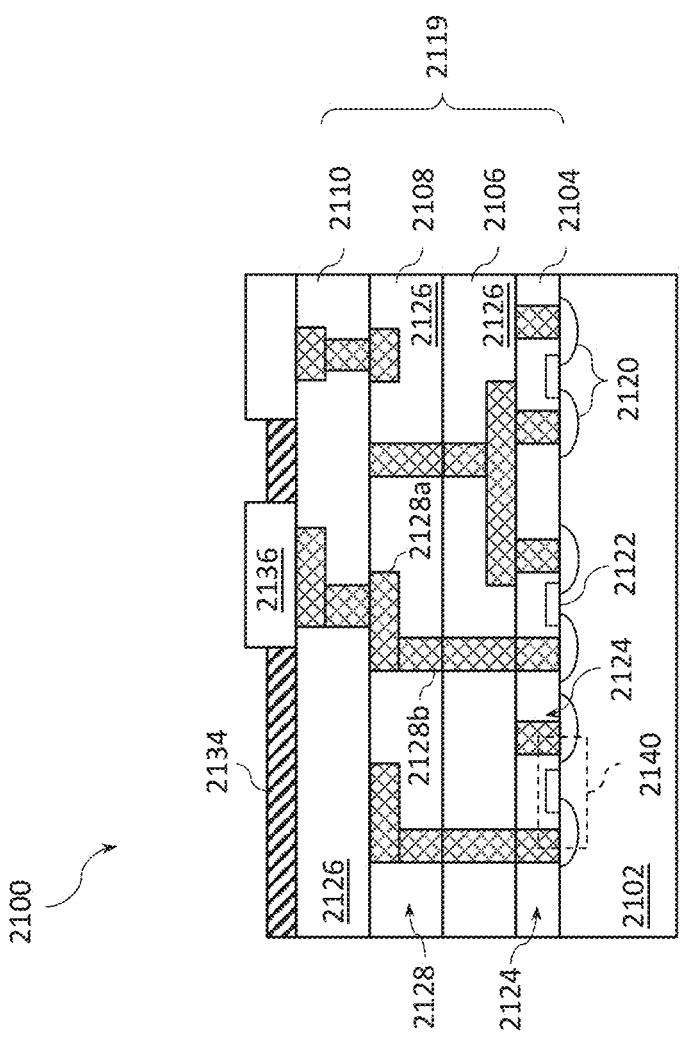
FIG. 11 is a cross-sectional side view of an IC device that may include one or more memory cells having FE capacitors integrated with transistor gates in accordance with any of the embodiments disclosed herein.

FIG. 11 is a cross-sectional side view of an IC device 2100 that may include one or more memory cells having FE capacitors integrated with transistor gates in accordance with any of the embodiments disclosed herein. In some embodiments, the IC device 2100 may serve as any of the dies 2256 in the IC package 2300 shown in FIG. 13

As shown in FIG. 11, the IC device 2100 may be formed on a substrate 2102 (e.g., the wafer 2000 of FIG. 10A) and may be included in a die (e.g., the die 2002 of FIG. 10B). The substrate 2102 may include any material that may serve as a foundation for an IC device 2100. The substrate 2102 may be a semiconductor substrate, and may be implemented as any of the examples provided above with reference to the IC device 300. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 10B) or a wafer (e.g., the wafer 2000 of FIG. 10A).

The IC device 2100 may include one or more device layers 2104 disposed on the substrate 2102. The device layer 2104 may include features of one or more transistors 2140 (e.g., MOSFETs) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 322. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the first and second conductor materials 324, 328.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a fin-FET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorus, or arsenic may be ion-implanted into the substrate 2102 to form the S/D regions 2120. An annealing process that activates the dopants and causes them to diffuse farther into the substrate 2102 may follow the ion implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorus. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 11 and may include a wide variety of other types and configurations such as, for example, planar transistors, non-planar transistors, or a combination of both. Furthermore, any of the transistors 2140 may be implemented as, or replaced with, transistors 110 having FE capacitors 120 integrated with its gates as described herein, e.g., any of the transistors 2140 may be implemented as, or replaced with, the memory cells 100 as described herein.

Electrical signals, such as power and/or input/output (I/O) signals, may be routed to and/or from the transistors 2140 of the device layer 2104 through one or more interconnect layers disposed on the device layer 2104 (illustrated in FIG. 11 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 11). Although a particular number of interconnect layers 2106-1210 is depicted in FIG. 11, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 11. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 11. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 12:
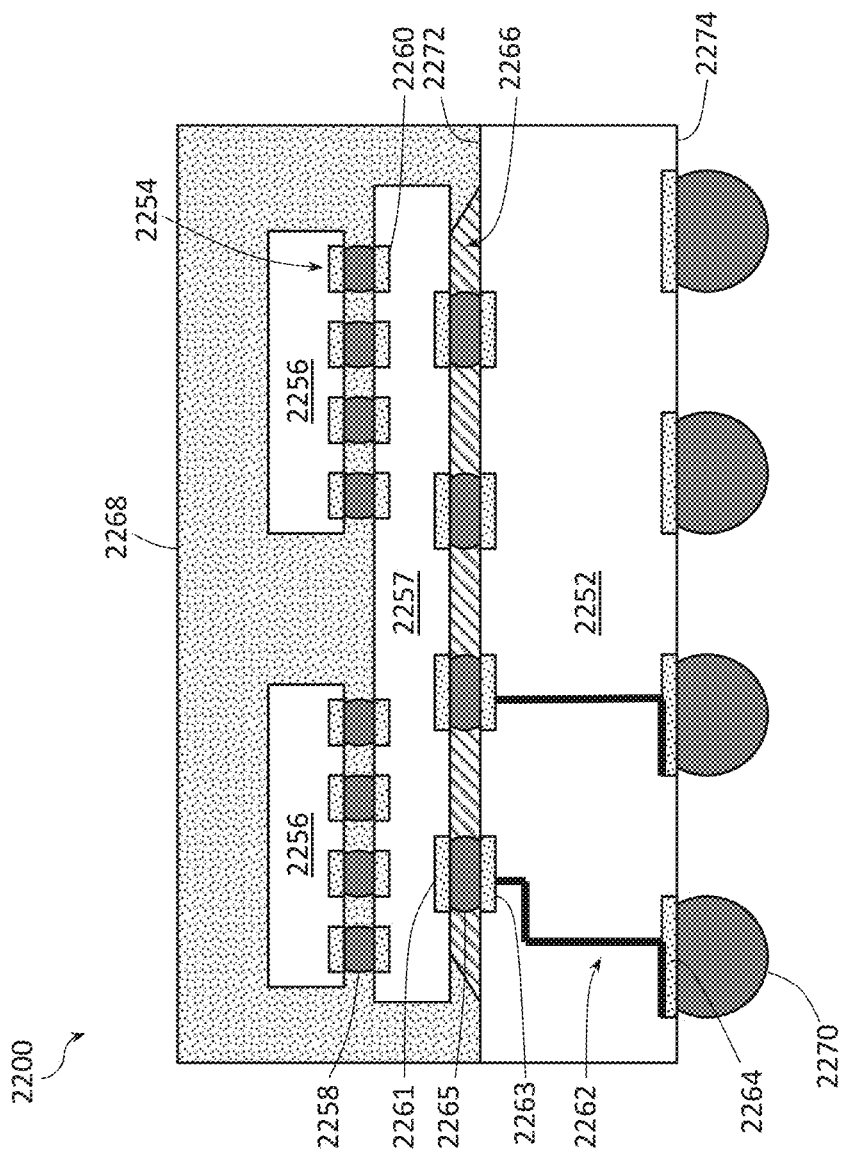
FIG. 12 is a cross-sectional side view of an IC package that may include one or more memory cells having FE capacitors integrated with transistor gates in accordance with any of the embodiments disclosed herein.

FIG. 12 is a side, cross-sectional view of an example IC package 2200 that may include one or more memory cells having FE capacitors integrated with transistor gates in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 11.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory, and/or dies implementing one or more memory cells having FE capacitors integrated with transistor gates). In some embodiments, any of the dies 2256 may include one or more memory cells having FE capacitors integrated with transistor gates, e.g., as discussed above with reference to FIG. 11; in some embodiments, at least some of the dies 2256 may not include any memory cells having FE capacitors integrated with transistor gates.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 13:
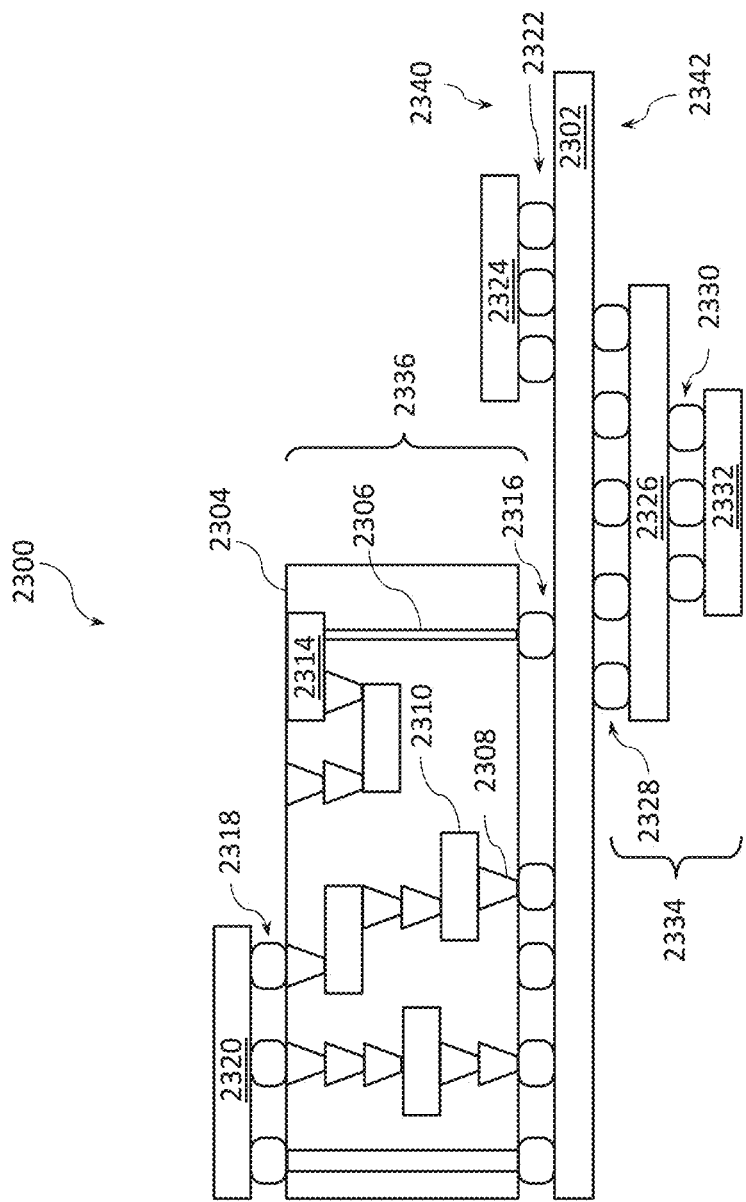
FIG. 13 is a cross-sectional side view of an IC device assembly that may include one or more memory cells having FE capacitors integrated with transistor gates in accordance with any of the embodiments disclosed herein.

FIG. 13 is a cross-sectional side view of an IC device assembly 2300 that may include components having one or more memory cells having FE capacitors integrated with transistor gates in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more memory cells having FE capacitors integrated with transistor gates in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include one or more memory cells having FE capacitors integrated with transistor gates on/over/in a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 10B), an IC device (e.g., the IC device 2100 of FIG. 11), or any other suitable component. In particular, the IC package 2320 may include one or more memory cells having FE capacitors integrated with transistor gates as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. In particular, one or more thermal contacts as described herein may be thermally coupled to at least some of the embedded devices 2314. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art. In some embodiments, the interposer 2304 may include one or more thermal contacts as described herein.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 14:
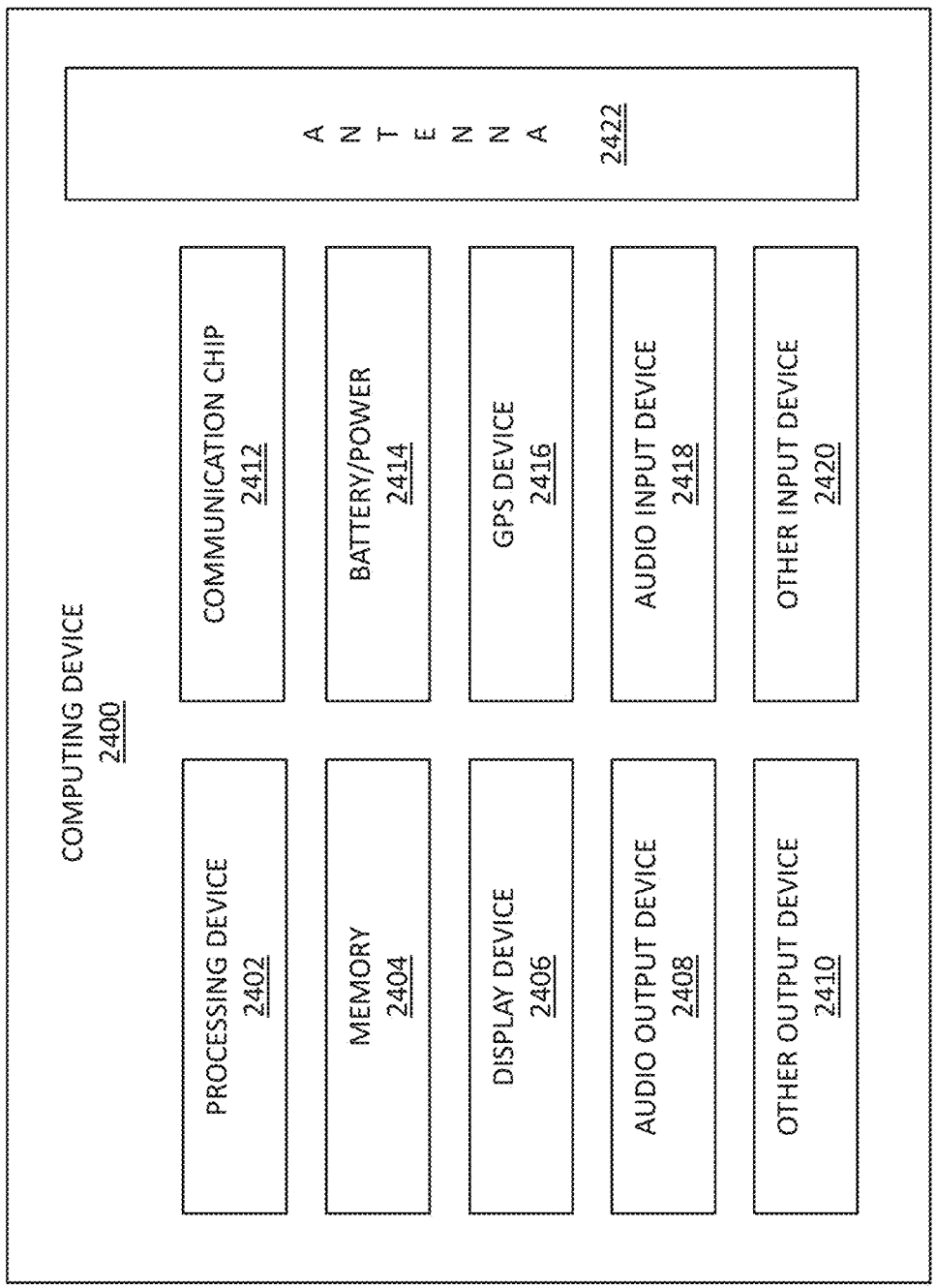
FIG. 14 is a block diagram of an example computing device that may include one or more components having memory cells having FE capacitors integrated with transistor gates in accordance with any of the embodiments disclosed herein.

FIG. 14 is a block diagram of an example computing device 2400 that may include one or more components with one or more memory cells having FE capacitors integrated with transistor gates in accordance with any of the embodiments disclosed herein. For example, any suitable ones of the components of the computing device 2400 may include a die (e.g., the die 2002 (FIG. 10B)) including one or more memory cells having FE capacitors integrated with transistor gates in accordance with any of the embodiments disclosed herein. Any of the components of the computing device 2400 may include an IC device 2100 (FIG. 11) and/or an IC package 2200 (FIG. 12). Any of the components of the computing device 2400 may include an IC device assembly 2300 (FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-MRAM). In various embodiments, any one of the processing device 2402 and the memory 2404 may include one or more memory cells having FE capacitors integrated with transistor gates as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a memory cell that includes a FET provided over a substrate, and further includes a ferroelectric (FE) capacitor including a first capacitor electrode (bottom electrode), a second capacitor electrode (top electrode), and a FE material between the first and second capacitor electrodes, where the FE capacitor is electrically coupled to a gate terminal of the transistor. In various embodiments, the transistor may be a planar transistor or a non-planar transistor. As used herein, unless specified otherwise, the term "coupled" refers to electrical coupling, e.g., one element coupled to another element may include one element being in direct electrical connection with another element.

Example 2 provides the memory cell according to example 1, where the FE capacitor is coupled to the gate terminal by having the first capacitor electrode of the FE capacitor being electrically coupled to the gate terminal of the transistor.

Example 3 provides the memory cell according to examples 1 or 2, where the second capacitor electrode of the FE capacitor is coupled to a WL.

Example 4 provides the memory cell according to any one of the preceding examples, where the transistor includes a first source/drain (S/D) terminal coupled to a BL. In some examples, the first S/D terminal (i.e., the terminal coupled to the BL) is a source terminal.

Example 5 provides the memory cell according to example 4, where the transistor includes a second S/D terminal coupled to a SL. In some examples, the second S/D terminal (i.e., the terminal coupled to the SL) is a drain terminal.

Example 6 provides the memory cell according to any one of the preceding examples, where the transistor includes a semiconductor material shaped as a fin extending away from a base (i.e., the transistor is a fin-FET).

Example 7 provides the memory cell according to example 6, where the memory cell further includes a gate dielectric material wrapping around an upper portion of the fin and, in some embodiments, being in contact with the upper portion of the fin; the first capacitor electrode includes a first conductor material (e.g., floating node metal), wrapping around the gate dielectric material and, in some embodiments, being in contact with the gate dielectric material; the FE material wraps around the first conductor material and, in some embodiments, is in contact with the first conductor material; and the second capacitor electrode includes a second conductor material (e.g., WL metal), enclosing the FE material, and, in some embodiments, being in contact with the ferroelectric material, where, in various embodiments, the first and second conductor materials may have the same or different compositions. In such a memory cell, the gate dielectric and the first conductor material wrapping around the upper portion of the fin may be seen as forming the gate terminal of the transistor, where at least a portion of the first conductor material at the same time forms the first capacitor electrode of the FE capacitor, and the second conductor material forms the second capacitor electrode of the FE capacitor.

Example 8 provides the memory cell according to any one of the preceding examples, where the FE capacitor is coupled to the gate terminal of the transistor by having the first capacitor electrode of the FE capacitor and a gate electrode of a gate stack of the transistor being formed of a continuous conductive material (i.e., said conductive material serves both as the first capacitor electrode of the FE capacitor and the gate electrode of the gate stack of the transistor, where the gate stack further includes a gate dielectric between the gate electrode and a semiconductor material forming a channel of the transistor).

Example 9 provides a memory cell that includes a gate stack provided over at least a portion of a semiconductor material (e.g., being in contact with the portion of the semiconductor material), where the gate stack includes a gate dielectric material, a first conductor material, a ferroelectric (FE) material, and a second conductor material.

Example 10 provides the memory cell according to example 9, where the gate dielectric material is between the semiconductor material and the first conductor material, the first conductor material is between the gate dielectric material and the FE material, and the FE material is between the first conductor material and the second conductor material.

Example 11 provides the memory cell according to examples 9 or 10, where the semiconductor material and the gate stack form a transistor (namely, a FET), where the semiconductor material is a channel material of the transistor, i.e., a region where, during operation of the transistor, one or more channels of the transistor may be formed.

Example 12 provides the memory cell according to example 11, where the transistor includes a first source/drain (S/D) terminal coupled to a BL. In some examples, the first S/D terminal (i.e., the terminal coupled to the BL) is a source terminal.

Example 13 provides the memory cell according to example 12, where the transistor includes a second S/D terminal coupled to a SL. In some examples, the second S/D terminal (i.e., the terminal coupled to the SL) is a drain terminal.

Example 14 provides the memory cell according to any one of examples 11-13, where the first conductor material, the FE material, and the second conductor material form a FE capacitor integrated within the gate stack of the transistor.

Example 15 provides the memory cell according to any one of examples 9-14, where the second conductor material is coupled to a WL.

Example 16 provides the memory cell according to any one of examples 9-15, where the semiconductor material is shaped as a fin extending away from a base, and the gate stack encloses an upper portion of the fin and may be in contact with the upper portion of the fin (i.e., the fin and the gate stack form a fin-FET).

Example 17 provides the memory cell according to example 16, where the gate dielectric material wraps around the upper portion of the fin and, in some embodiments, may be in contact with the upper portion of the fin; the first conductor material (e.g., floating node metal) wraps around the gate dielectric material and, in some embodiments, may be in contact with the gate dielectric material; the FE material wraps around the first conductor material and, in some embodiments, may be in contact with the first conductor material; and the second conductor material (e.g., WL metal) encloses the FE material, and, in some embodiments, may be in contact with the ferroelectric material, where, in various embodiments, the first and second conductor materials may have the same or different compositions. In such a memory cell, the gate dielectric and the first conductor material wrapping around the upper portion of the fin may be seen as forming the gate terminal of the transistor, where at least a portion of the first conductor material at the same time forms the first capacitor electrode of a FE capacitor, and the second conductor material forms the second capacitor electrode of the FE capacitor.

Example 18 provides a memory cell that includes a gate dielectric material provided over at least a portion of a semiconductor material and, in some embodiments, being in contact with said portion of the semiconductor material. The memory cell further includes a first conductor material (e.g., floating node metal) provided over at least a portion of the gate dielectric material and, in some embodiments, being in contact with said portion of the gate dielectric material; a ferroelectric (FE) material provided over at least a portion of the first conductor material and, in some embodiments, being in contact with said portion of the first conductor material; and a second conductor material (e.g., WL metal) provided over at least a portion of the ferroelectric material, and, in some embodiments, being in contact with said portion of the ferroelectric material, where, in various embodiments, the first and second conductor materials may have the same or different compositions.

Example 19 provides the memory cell according to example 18, where the semiconductor material is shaped as a fin extending away from a base.

Example 20 provides the memory cell according to example 19, where the gate dielectric material wraps around an upper portion of the fin and, in some embodiments, may be in contact with the upper portion of the fin; the first conductor material wraps around the gate dielectric material and, in some embodiments, may be in contact with the gate dielectric material; the FE material wraps around the first conductor material and, in some embodiments, may be in contact with the first conductor material; and the second conductor material encloses the FE material, and, in some embodiments, may be in contact with the ferroelectric material. In such a memory cell, the gate dielectric and the first conductor material wrapping around the upper portion of the fin may be seen as forming a gate terminal of a fin-FET, where at least a portion of the first conductor material at the same time forms the first capacitor electrode of a FE capacitor, and the second conductor material forms the second capacitor electrode of the FE capacitor.

Example 21 provides the memory cell according to any one of examples 18-20, where the memory cell includes a transistor, and the semiconductor material is a channel material of the transistor.

Example 22 provides the memory cell according to example 21, where the transistor includes a first source/drain (S/D) terminal coupled to a BL. In some examples, the first S/D terminal (i.e., the terminal coupled to the BL) is a source terminal.

Example 23 provides the memory cell according to example 22, where the transistor includes a second S/D terminal coupled to a SL. In some examples, the second S/D terminal (i.e., the terminal coupled to the SL) is a drain terminal.

Example 24 provides the memory cell according to any one of examples 18-23, where the second conductor material is coupled to a WL.

Example 25 provides a memory cell that includes a transistor including a semiconductor material and a gate dielectric provided over at least a portion of the semiconductor material; and a ferroelectric (FE) capacitor including a first capacitor electrode (bottom electrode), a second capacitor electrode (top electrode), and a FE material between the first and second capacitor electrodes, where the first capacitor electrode is provided over, e.g., in contact with, at least a portion of the gate dielectric of the transistor.

Example 26 provides the memory cell according to example 25, where the second capacitor electrode of the FE capacitor is coupled to a WL.

Example 27 provides the memory cell according to examples 25 or 26, where the transistor includes a first source/drain (S/D) terminal coupled to a BL. In some examples, the first S/D terminal (i.e., the terminal coupled to the BL) is a source terminal.

Example 28 provides the memory cell according to example 27, where the transistor includes a second S/D terminal coupled to a SL. In some examples, the second S/D terminal (i.e., the terminal coupled to the SL) is a drain terminal.

Example 29 provides the memory cell according to any one of examples 25-28, where the semiconductor material is shaped as a fin extending away from a base (i.e., the transistor is a fin-FET).

Example 30 provides the memory cell according to example 29, where the gate dielectric material wraps around an upper portion of the fin and, in some embodiments, is in contact with the upper portion of the fin; the first capacitor electrode includes a first conductor material (e.g., floating node metal) that wraps around the gate dielectric material and, in some embodiments, is in contact with the gate dielectric material; the FE material wraps around the first conductor material and, in some embodiments, is in contact with the first conductor material; and a second capacitor electrode includes a second conductor material (e.g., WL metal) that is provided over the FE material, and, in some embodiments, is in contact with the ferroelectric material, where, in various embodiments, the first and second conductor materials may have the same or different compositions. In such a memory cell, the gate dielectric and the first conductor material wrapping around the upper portion of the fin may be seen as forming the gate terminal of the transistor, where at least a portion of the first conductor material at the same time forms the first capacitor electrode of the FE capacitor, and the second conductor material forms the second capacitor electrode of the FE capacitor.

Example 31 provides the memory cell according to any one of the preceding examples, where the FE material is a thin-film FE material.

Example 32 provides the memory cell according to any one of the preceding examples, where the FE material has a thickness between about 1 nanometers and 10 nanometers.

Example 33 provides the memory cell according to any one of the preceding examples, where the FE material includes one or more of a material including hafnium, zirconium, and oxygen (e.g., hafnium zirconium oxide), a material including silicon, hafnium, and oxygen (e.g., silicon-doped hafnium oxide), a material including germanium, hafnium, and oxygen (e.g., germanium-doped hafnium oxide), a material including aluminum, hafnium, and oxygen (e.g., aluminum-doped hafnium oxide), and a material including yttrium, hafnium, and oxygen (e.g., yttrium-doped hafnium oxide).

Example 34 provides the memory cell according to any one of the preceding examples, where the gate dielectric is a high-k dielectric material.

Example 35 provides a memory device that includes a substrate and a plurality of memory cells provided over the substrate, where each of one or more of the plurality of memory cells is a memory cell according to any one of the preceding examples (e.g., any one of examples 1-34).

Example 36 provides the memory device according to example 35, further including an insulator structure configured to electrically isolate, from one another, the first conductor materials (or the first capacitor electrodes, when the memory cells are memory cells according to any one of the preceding examples, e.g., examples 1-8) of each pair of adjacent memory cells.

Example 37 provides a method of operating a memory cell including a transistor that includes a semiconductor material and a gate terminal that includes a gate dielectric provided over at least a portion of the semiconductor material, and further including a ferroelectric (FE) capacitor that includes a first capacitor electrode (bottom electrode), a second capacitor electrode (top electrode), and a FE material between the first and second capacitor electrodes, where the first capacitor electrode is provided over, e.g., in contact with, at least a portion of the gate dielectric of the transistor. The method includes driving a WL, coupled to the second capacitor electrode of the transistor, to cause the transistor to turn on, in case the logic state to be programmed on the transistor is "1" (otherwise, not driving the WL); and programming the FE capacitor by, when the transistor is turned on in case the logic state to be programmed on the transistor is "1" (otherwise WL=0V), driving a BL, which is coupled to a first source/drain (S/D) terminal of the transistor, while a SL, which is coupled to a second S/D terminal of the transistor, is connected to a source supply voltage (VSS) (e.g., to a ground source) or to zero Volts to program/write a desired logic state of the memory cell on the FE capacitor. Such operation is configured to achieve a desired polarization state for the FE material, said polarization state representing a desired logic state of the memory cell.

Example 38 provides the method according to example 37, where the method includes applying a first set of voltages to the BL and the WL, while SL is connected to zero Volts, to cause a first logic state to be programmed on the FE capacitor, and/or applying a second set of voltages to the BL and the WL, while the SL connected to zero Volts, to cause a second logic state to be programmed on the FE capacitor.

Example 39 provides the method according to examples 37 or 38, further including, after driving the BL to program the logic state on the FE capacitor, switching the WL off.

Example 40 provides the method according to any one of examples 37-39, further including reading the memory cell by turning the WL on and sensing the BL to determine the logic state programmed on the FE capacitor.

Example 41 provides the method according to any one of examples 37-40, where the memory cell is a memory cell according to any one of the preceding examples (e.g., any one of examples 1-34) and/or is a memory cell of a plurality of memory cells of a memory device according to any one of the preceding examples (e.g., any one of examples 35-36).

Example 42 provides a method of operating a memory cell including a transistor that includes a semiconductor material and a gate terminal that includes a gate dielectric provided over at least a portion of the semiconductor material, and further including a ferroelectric (FE) capacitor that includes a first capacitor electrode (bottom electrode), a second capacitor electrode (top electrode), and a FE material between the first and second capacitor electrodes, where the first capacitor electrode is provided over, e.g., in contact with, at least a portion of the gate dielectric of the transistor. The method includes driving a world-line (WL), coupled to the second capacitor electrode of the transistor, to cause the transistor to turn on; and reading the FE capacitor by sensing the current on a BL, coupled to a first source/drain (S/D) terminal of the transistor, to determine a logic state that was programmed in the FE capacitor.

Example 43 provides the method according to example 42, where the memory cell is a memory cell according to any one of the preceding examples (e.g., any one of examples 1-34) and/or is a memory cell of a plurality of memory cells of a memory device according to any one of the preceding examples (e.g., any one of examples 35-36).

Example 44 provides an IC package that includes an IC die, including a memory cell according to any one of the preceding examples (e.g., any one of examples 1-34) and/or a memory device according to any one of the preceding examples (e.g., any one of examples 35-36); and a further component, coupled to the IC die.

Example 45 provides the IC package according to example 44, where the further component is one of a package substrate, a flexible substrate, or an interposer.

Example 46 provides the IC package according to examples 44 or 45, where the further component is coupled to the IC die via one or more first-level interconnects.

Example 47 provides the IC package according to example 46, where the one or more first-level interconnects include one or more solder bumps, solder posts, or bond wires.

Example 48 provides a computing device that includes a circuit board; and an IC die coupled to the circuit board, where the IC die includes a memory cell according to any one of the preceding examples (e.g., any one of examples 1-34) and/or a memory device according to any one of the preceding examples (e.g., any one of examples 35-36).

Example 49 provides the computing device according to example 48, where the computing device is a wearable computing device (e.g., a smart watch) or handheld computing device (e.g., a mobile phone).

Example 50 provides the computing device according to examples 48 or 49, where the computing device is a server processor.

Example 51 provides the computing device according to examples 48 or 49, where the computing device is a motherboard.

Example 52 provides the computing device according to any one of examples 48-51, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory cell, comprising:
a transistor comprising a fin and a gate; and
a ferroelectric (FE) capacitor comprising a first capacitor electrode, a second capacitor electrode, and a FE material between the first and second capacitor electrodes, wherein:
a gate dielectric material of the gate wraps around an upper portion of the fin,
the first capacitor electrode includes a first conductor material, wherein the first conductor material at least partially wraps around the gate dielectric material,
the FE material at least partially wraps around the first conductor material, and
the second capacitor electrode includes a second conductor material over the FE material.

2. The memory cell according to claim 1, wherein the second capacitor electrode is coupled to a word-line.

3. The memory cell according to claim 1, wherein the transistor includes a first region of a pair of a source region and a drain region, the first region -coupled to a bit-line, and further includes a second region of the pair, the second region coupled to a select-line.

4. An integrated circuit (IC) device, comprising:
a fin comprising a semiconductor material; and
a gate stack over the semiconductor material of an upper portion of the fin, the gate stack comprising:
a gate dielectric material wrapping around the upper portion of the fin,
a first conductor material wrapping around the gate dielectric material,
a ferroelectric (FE) material wrapping around the first conductor material, and
a second conductor material at least partially over the FE material.

5. The IC device according to claim 4, wherein:
the gate dielectric material is between the semiconductor material and the first conductor material,
the first conductor material is between the gate dielectric material and the FE material, and
the FE material is between the first conductor material and the second conductor material.

6. The IC device according to claim 4, wherein the semiconductor material and the gate stack are parts of a transistor.

7. The IC device according to claim 6, wherein the transistor includes a first region of a pair of a source region and a drain region, the first region coupled to a bit-line and a second region of the pair, the second region coupled to a select-line.

8. The IC device according to claim 6, wherein the first conductor material, the FE material, and the second conductor material are parts of a FE capacitor integrated within the gate stack of the transistor.

9. The IC device according to claim 4, further comprising a word-line, coupled to the second conductor material.

10. An integrated circuit (IC) package, comprising:
an IC die; and
a further component, coupled to the IC die,
wherein the IC die includes:
a fin comprising a semiconductor material,
a gate dielectric material wrapping around an upper portion of the fin,
a first conductor material wrapping around the gate dielectric material,
a ferroelectric (FE) material wrapping around the first conductor material, and
a second conductor material over at least a portion of the FE material.

11. The IC package according to claim 10, wherein:
the IC die includes a transistor,
the semiconductor material is a channel material of the transistor, the transistor includes a first region of a pair of a source region and a drain region, the first region coupled to a bit-line, and the transistor further includes a second region of the pair, the second region coupled to a select-line.

12. The IC package according to claim 10, wherein the second conductor material is coupled to a word-line.

13. The IC package according to claim 10, wherein the FE material includes one or more of:

a material including hafnium, zirconium, and oxygen,
a material including silicon, hafnium, and oxygen,
a material including germanium, hafnium, and oxygen,
a material including aluminum, hafnium, and oxygen, and
a material including yttrium, hafnium, and oxygen.

14. A method of operating a memory cell comprising a transistor that includes a semiconductor material in a shape of a fin, and further includes a gate stack that includes a gate dielectric material, a first conductor material, a ferroelectric (FE) material, and a second conductor material, the method comprising:

driving a world-line (WL), coupled to the second conductor material, to cause the transistor to turn on; and when the transistor is turned on, driving a bit-line (BL), coupled to a first region of a pair of a source region and a drain region of the transistor while a select-line (SL), coupled to a second region of the pair, is connected to a source supply voltage (Vss) or to zero Volts to program a logic state on the FE material, wherein:

the gate dielectric material wraps around the upper portion of the fin, the first conductor material wraps around the gate dielectric material, the FE material wraps around the first conductor material, and the second conductor material is at least partially over the FE material.

15. The method according to claim 14, wherein the method includes:

applying a first set of voltages to the BL and the WL, while SL is connected to zero Volts, to cause a first logic state to be programmed on the FE material, and/or applying a second set of voltages to the BL and the WL, while the SL connected to zero Volts, to cause a second logic state to be programmed on the FE material.

16. The method according to claim 14, further comprising:

after driving the BL to program the logic state on the FE material, switching the WL off.

17. The method according to claim 16, further comprising:

turning the WL on and sensing the BL to determine the logic state programmed on the FE material.

18. The memory cell according to claim 1, wherein a thickness of the first conductor material is between about 1 and 20 nanometers.

19. The IC device according to claim 4, wherein the FE material is a thin-film FE material.

20. The IC device according to claim 4, wherein the second conductor material encloses the FE material.

21. The IC package according to claim 10, wherein a thickness of the first conductor material is between about 1 and 20 nanometers.

22. The IC package according to claim 10, wherein the further component is one of a package substrate, a flexible substrate, or an interposer.

23. The method according to claim 14, wherein the FE material is a thin-film FE material.

24. The method according to claim 14, wherein the second conductor material encloses the FE material.

* * * * *

UNITED STATES PATENT AND TRADEMARK OFFICE
CERTIFICATE OF CORRECTION

PATENT NO. : 11,502,103 B2
APPLICATION NO. : 16/114272
DATED : November 15, 2022
INVENTOR(S) : Daniel H. Morris et al.

It is certified that error appears in the above-identified patent and that said Letters Patent is hereby corrected as shown below:

On the Title Page

Item (54), under "Title", in Column 1, and in the Specification Column 1, Line 3, delete "TRANSTOR" and insert -- TRANSISTOR --, therefor.

On Page 2, item (56), under "Other Publications", in Column 2, Line 17, delete "Sates,"" and insert -- Gates," --, therefor.

Signed and Sealed this
Twenty-first Day of March, 2023

Katherine Kelly Vidal
*Director of the United States Patent and Trademark Office*